US011294194B2

(12) United States Patent
Yamamoto et al.

(10) Patent No.: US 11,294,194 B2
(45) Date of Patent: Apr. 5, 2022

(54) IMAGE DISPLAY DEVICE AND VIRTUAL IMAGE DISPLAY APPARATUS

(71) Applicant: SEIKO EPSON CORPORATION, Tokyo (JP)

(72) Inventors: Hidetoshi Yamamoto, Suwa (JP); Yuiga Hamade, Matsumoto (JP)

(73) Assignee: SEIKO EPSON CORPORATION, Tokyo (JP)

(*) Notice: Subject to any disclaimer, the term of this patent is extended or adjusted under 35 U.S.C. 154(b) by 224 days.

(21) Appl. No.: 16/802,758

(22) Filed: Feb. 27, 2020

(65) Prior Publication Data
US 2020/0278558 A1 Sep. 3, 2020

(30) Foreign Application Priority Data

Feb. 28, 2019 (JP) .............. JP2019-036988

(51) Int. Cl.
G02B 27/14 (2006.01)
G02B 27/01 (2006.01)
H01L 27/32 (2006.01)
G03B 33/12 (2006.01)

(52) U.S. Cl.
CPC ....... G02B 27/141 (2013.01); G02B 27/0172 (2013.01); G03B 33/12 (2013.01); H01L 27/3218 (2013.01); H01L 27/3232 (2013.01); H01L 27/3276 (2013.01); G02B 2027/0114 (2013.01); G02B 2027/0178 (2013.01)

(58) Field of Classification Search
CPC ...... G03B 21/00; G03B 21/28; G03B 21/145; G03B 21/208; G03B 21/2013; G03B 21/2033; G03B 21/2053; G03B 33/00; G03B 33/12; G03B 33/16; G02B 27/0101; G02B 27/0172; G02B 27/141; G02B 27/149; G02B 2027/0114; G02B 2027/0136; G02B 2027/0143; G02B 2027/0178; H01L 21/28; H01L 21/265; H01L 21/336; H01L 27/12; H01L 27/28; H01L 27/322; H01L 27/1248; H01L 27/1292; H01L 27/3232; H01L 27/3276
See application file for complete search history.

(56) References Cited

U.S. PATENT DOCUMENTS

2003/0116768 A1* 6/2003 Ishikawa ........... H01L 29/78633 257/79
2004/0027545 A1* 2/2004 Yokoyama ........ G02F 1/133621 353/52
2019/0013364 A1* 1/2019 Yokota ............... H01L 51/5056

FOREIGN PATENT DOCUMENTS

JP 2000-275732 A 10/2000

* cited by examiner

Primary Examiner — Sultan Chowdhury
(74) Attorney, Agent, or Firm — Oliff PLC

(57) ABSTRACT

An image display device according to the present disclosure includes a first self-luminous display element that self-emits an image of first color light, a second self-luminous display element that self-emits an image of second color light, a third self-luminous display element that self-emits an image of third color light, and a prism including a dichroic mirror that synthesizes images of three colors, the first, the second, and the third self-luminous display element are each configured to extract light from a side of a semireflective semitransmissive electrode included in the first, the second, and the third self-luminous display element, and at least one of sums of a thickness of a transparent electrode and a thickness of an optical adjustment layer differs from other in the first, the second, and the third self-luminous display element.

8 Claims, 14 Drawing Sheets

IMAGE DISPLAY DEVICE AND VIRTUAL IMAGE DISPLAY APPARATUS The present application is based on, and claims priority from JP Application Serial Number 2019-036988, filed Feb. 28, 2019, the disclosure of which is hereby incorporated by reference herein in its entirety.

BACKGROUND

1. Technical Field

The present disclosure relates to an image display device including a self-luminous display element and a virtual image display apparatus.

2. Related Art

In recent years, as an image display device using a panel including a self-luminous display element, there has been proposed an image display device having a configuration in which panels, including three self-luminous display elements that emit light of colors, such as red color, green color, and blue color, are disposed to face three incident surfaces of a dichroic prism.

In the image display device thus configured, as an image display device in which a panel including a self-luminous display element is configured by an organic electroluminescent panel (an organic EL panel), for example, while red image light emitted from a red color organic electroluminescent panel is reflected by a first dichroic mirror toward an emission surface, the first dichroic mirror transmits blue image light emitted from a blue color organic electroluminescent panel and green image light emitted from a green color organic electroluminescent panel.

In addition, while the blue image light emitted from the blue color organic electroluminescent panel is reflected by a second dichroic mirror toward the emission surface, the second dichroic mirror transmits the red image light emitted from the red color organic electroluminescent panel and the green image light emitted from the green color organic electroluminescent panel.

Accordingly, synthesized light that is a synthesis of the red, green, and blue color images is emitted from the emission surface of the dichroic prism, and the image display device can thus display a color image (for example, JP 2000-275732 A).

Here, in the image display device described in JP 2000-275732 A, the organic EL panels include an organic EL element as a backlight, and further include a liquid crystal display disposed between the organic EL element and the dichroic mirror to form red, green, and blue color images.

In addition, JP 2000-275732 A describes that, in the image display device, the organic EL element being a backlight is configured to include a microresonator, to thus cause the organic EL element to emit light of the respective colors such as red, green, and blue colors, however, actually, no description is given about a specific method for adjusting the colors.

SUMMARY

The present disclosure is made to address the above-described issues, and can be achieved as the following application example.

An image display device according to an application example of the present disclosure includes a first self-luminous display element that emits an image of first color light having a peak in a first color region, a second self-luminous display element that emits an image of second color light having a peak in a second color region, a third luminous display element that self-emits an image of third color light having a peak in a third color region, and a prism including a dichroic mirror that synthesizes the first color light, the second color light, and the third color light, in which the first self-luminous display element includes a first support substrate, and a first reflective film, a first optical adjustment layer, a first transparent electrode, a first light-emitting layer, and a first semireflective semitransmissive electrode that are laminated in order from the first support substrate side, the second self-luminous display element includes a second support substrate, and a second reflective film, a second optical adjustment layer, a second transparent electrode, a second light-emitting layer, and a second semireflective semitransmissive electrode that are laminated in order from the second support substrate side, and the third self-luminous display element includes a third support substrate, and a third reflective film, a third optical adjustment layer, a third transparent electrode, a third light-emitting layer, and a third semireflective semitransmissive electrode that are laminated in order from the third support substrate side, in which the first color light is extracted from the first semireflective semitransmissive electrode of the first self-luminous display element, the second color light is extracted from the second semireflective semitransmissive electrode of the second self-luminous display element, and the third color light is extracted from the third semireflective semitransmissive electrode of the third self-luminous display element, in which when a sum of a thickness of the first transparent electrode and a thickness of the first optical adjustment layer is a first lamination thickness, a sum of a thickness of the second transparent electrode and a thickness of the second optical adjustment layer is a second lamination thickness, and a sum of a thickness of the third transparent electrode and a thickness of the third optical adjustment layer is a third lamination thickness, the first lamination thickness differs from at least one of the second lamination thickness or the third lamination thickness.

DESCRIPTION OF EXEMPLARY EMBODIMENTS

Figure 1:
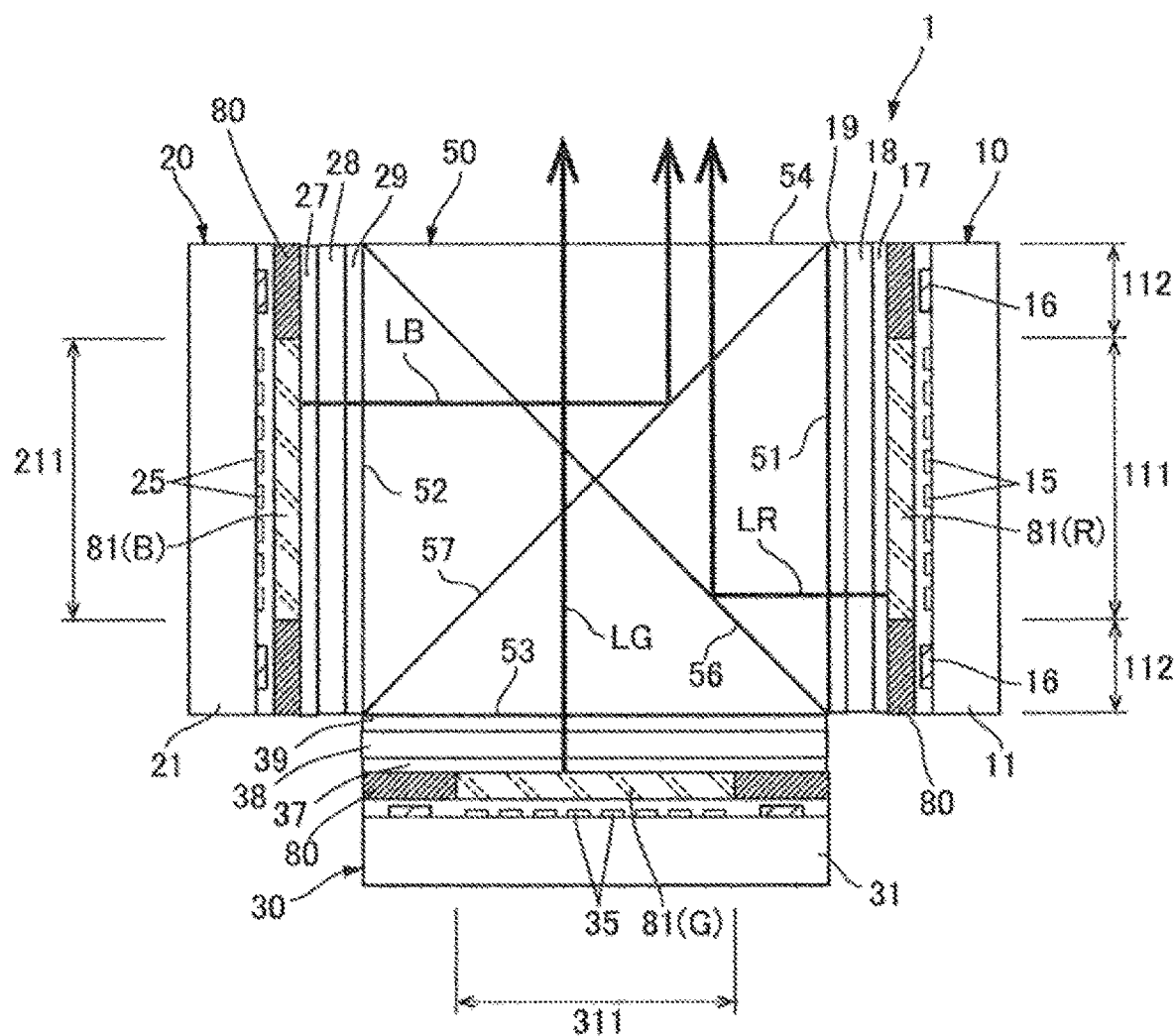
FIG. 1 is a plan view schematically illustrating an image display device according to a first embodiment of the present disclosure.

Hereinafter, an image display device and a virtual image display apparatus of the present disclosure will be described in connection with preferred embodiments illustrated in accompanied drawings.

Note that descriptions will be given below about a case in which the image display device of the present disclosure is applied to a device including an organic electroluminescent element (an organic EL element) as a self-luminous element. In addition, for convenience of explanation, the scale of each of the portions is appropriately varied in the drawings, and the illustrated configuration does not necessarily match the actual scale.

Image Display Device

First Embodiment

Overall Configuration

Figure 2:
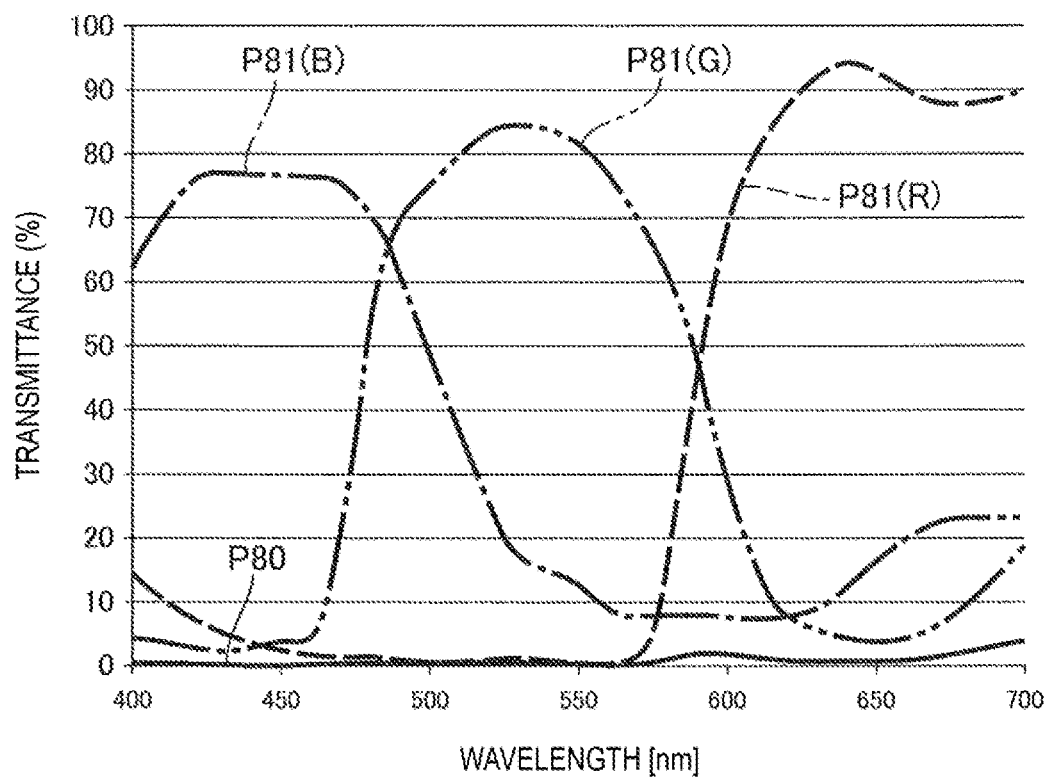
FIG. 2 is a graph illustrating transmittance-wavelength characteristics of a first coloring layer and the like illustrated in FIG. 1.
Figure 3:
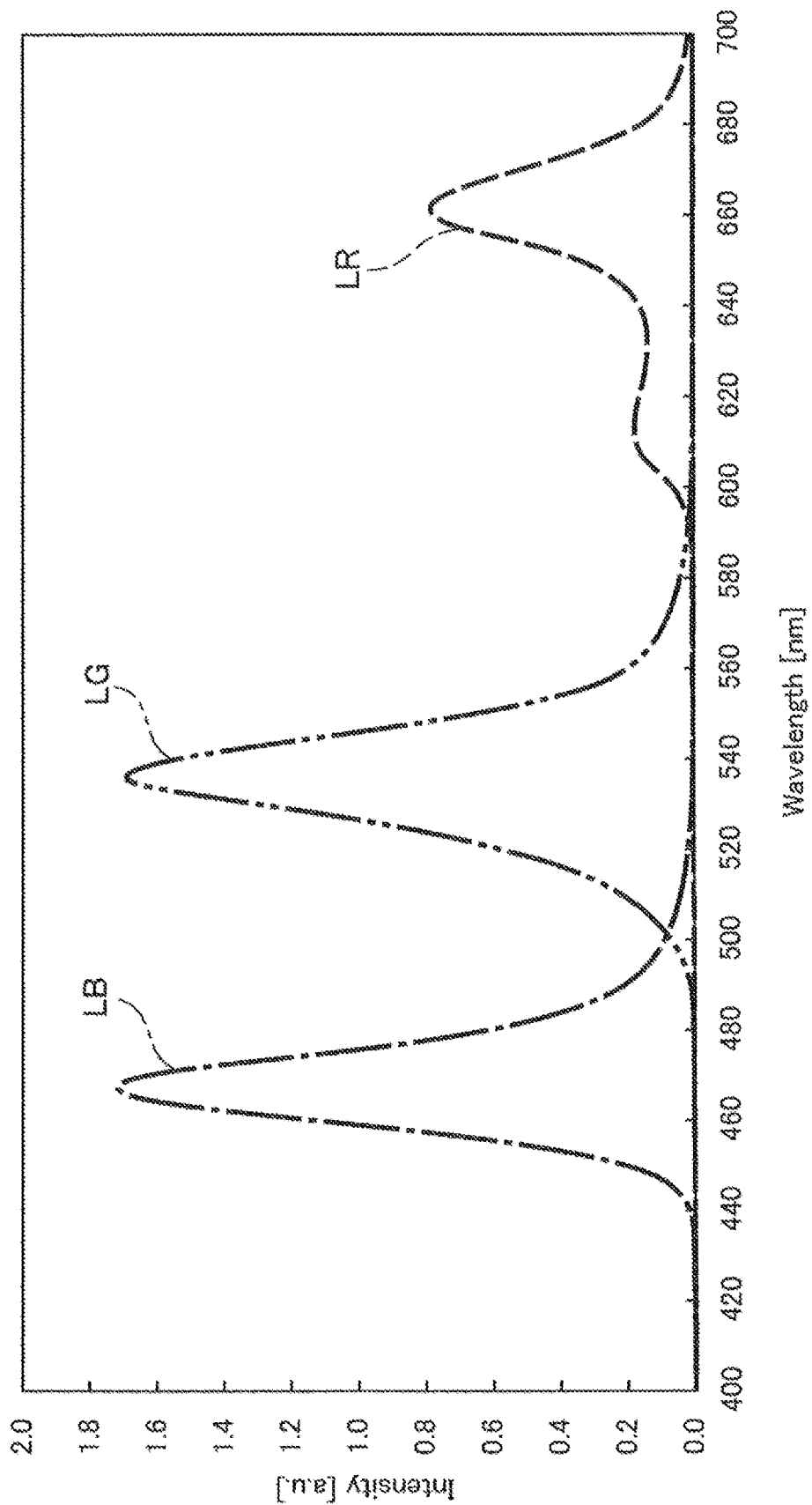
FIG. 3 is a graph illustrating a spectrum of first image light and the like illustrated in FIG. 1.
Figure 4:
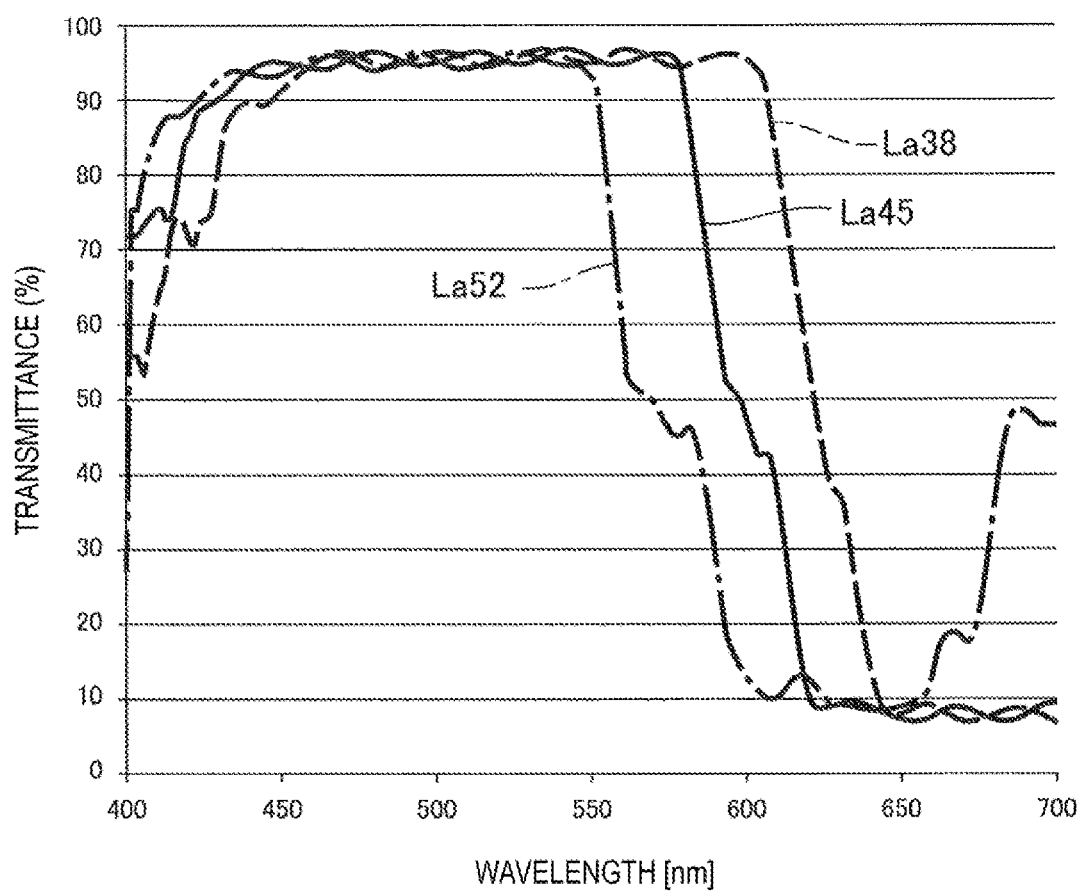
FIG. 4 is a graph illustrating transmittance-wavelength characteristics of a first dichroic mirror illustrated in FIG. 1.
Figure 5:
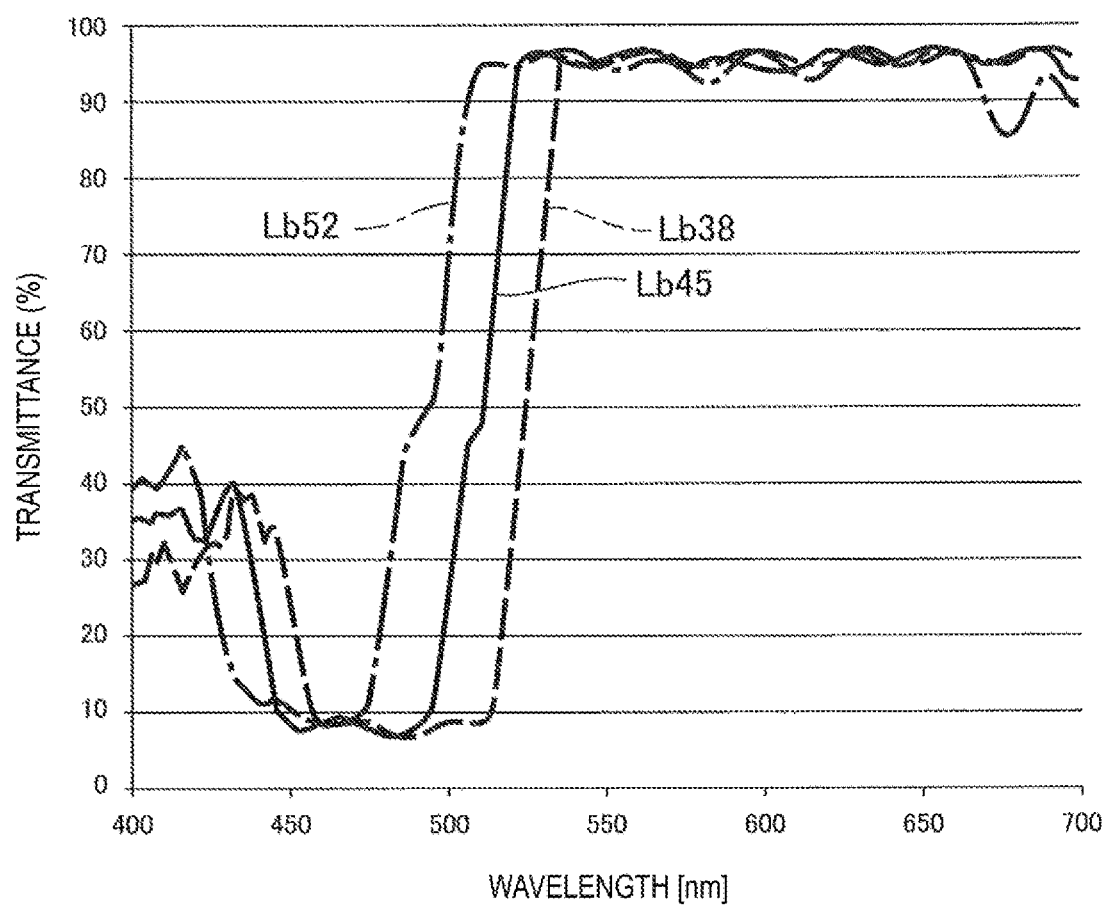
FIG. 5 is a graph illustrating transmittance-wavelength characteristics of a second dichroic mirror illustrated in FIG. 1.

FIG. 1 is a plan view illustrating an image display device of a first embodiment according to the present disclosure. FIG. 2 is a graph illustrating transmittance-wavelength characteristics of a first coloring layer (R) and the like illustrated in FIG. 1. FIG. 3 is a graph illustrating a spectrum of first image light LR and the like illustrated in FIG. 1. FIG. 4 is a graph illustrating transmittance-wavelength characteristics of a first dichroic mirror 56 illustrated in FIG. 1. FIG. 5 is a graph illustrating transmittance-wavelength characteristics of a second dichroic mirror 57 illustrated in FIG. 1.

As illustrated in FIG. 1, an image display device 1 includes a first panel 10 including a plurality of first light-emitting elements 15 in a first display region 111 being a display region of a first substrate 11, a second panel 20 including a plurality of second light-emitting elements 25 in a second display region 211 being a display region of a second substrate 21, a third panel 30 including a plurality of third light-emitting elements 35 in a third display region 311 being a display region of a third substrate 31, and a dichroic prism 50.

The first panel 10 emits first image light LR of first color light having a peak in a first wavelength region from the first display region 111 by self-luminous light of the plurality of first light-emitting elements 15, the second panel 20 emits second image light LB of second color light having a peak in a second wavelength region from the second display region 211 by self-luminous light of the plurality of second light-emitting elements 25, and the third panel 30 emits third image light LG of third color light having a peak in a third wavelength region from the third display region 311 by self-luminous light of the plurality of third light-emitting elements 35. Note that the first wavelength region, the second wavelength region, and the third wavelength region are different from one another, and may have an overlapped range in some partial regions.

In the first embodiment, the first wavelength region ranges, for example, from 620 nm to 750 nm, and the first panel 10 has a peak in this region and emits the first image light LR of red color light being the first color light. Further, the second wavelength region ranges, for example, from 450 nm to 495 nm, and the second panel 20 has a peak in this region and emits the second image light LB of blue color light being the second color light. Moreover, the third wavelength region ranges, for example, from 495 nm to 570 nm, and the third panel 30 has a peak in this region and emits the third image light LG of green color light being the third color light.

In the image display device 1 thus configured, the first panel 10 emits red image light by self-luminous light of the plurality of first light-emitting elements 15 provided in the first display region 111, and includes, further at the first substrate 11, on a side of the dichroic prism 50 with respect to the first light-emitting elements 15, a first coloring layer 81(R) that can selectively transmit red image light emitted from the first light-emitting elements 15, that is, the first image light LR in the first wavelength region.

Further, the second panel 20 emits blue image light by self-luminous light of the plurality of second light-emitting elements 25 provided in the second display region 211, and the second panel 20 includes, further at the second substrate 21, on a side of the dichroic prism 50 with respect to the second light-emitting elements 25, a second coloring layer 81(B) that can selectively transmit blue image light emitted from the second light-emitting elements 25, that is, the second image light LB in the second wavelength region.

Moreover, the third panel 30 emits green image light by self-luminous light of the plurality of third light-emitting elements 35 provided in the third display region 311, and the third panel 30 includes, further at the third substrate 31, on a side of the dichroic prism 50 with respect to the third light-emitting elements 35, a third coloring layer 81(G) that can selectively transmit green image light emitted from the third light-emitting elements 35, that is, the third image light LG in the third wavelength region.

In addition, in the first embodiment, the first light-emitting elements 15, the second light-emitting elements 25, and the third light-emitting elements 35 included in the first panel 10, the second panel 20, and the third panel 30, are all configured by an organic electroluminescent element, where the plurality of first light-emitting elements 15, the plurality of second light-emitting elements 25, and the plurality of third light-emitting elements 35 emit red image light, blue image light, and green image light, respectively. That is, in the panels 10, 20, and 30 of the first embodiment, the plurality of first light-emitting elements 15 constitute the first self-luminous display element that self-emits red image light as the first color, further, the plurality of second light-emitting elements 25 constitute the second self-luminous display element that self-emits blue image light as the second color, and in addition, the plurality of third light-emitting elements 35 constitute the third self-luminous display element that self-emits green image light as the third color.

Further, the first coloring layer 81(R), which has, for example, the transmittance-wavelength characteristics indicated by a dashed line P81(R) as illustrated in FIG. 2, forms a light-absorbing filter layer that absorbs light other than the red color light. Next, the second coloring layer 81(B), which has the transmittance-wavelength characteristics indicated by a one-dot chain line P81(B), forms a light-absorbing filter layer that absorbs light other than the blue color light. Next, the third coloring layer 81(G), which has the transmittance-wavelength characteristics indicated by a two-dot chain line P81(G), forms a light-absorbing filter layer that absorbs light other than the green color light.

Accordingly, as illustrated in FIG. 3, the first image light LR represents red image light having a spectrum indicated by a dashed line LR by an action between the first light-emitting elements 15 and the first coloring layer 81(R), the second image light LB represents blue image light having a spectrum indicated by a dot-dash line LB by an action between the second light-emitting elements 25 and the second coloring layer 81(B), and the third image light LG represents green image light having a spectrum indicated by a two-dot chain line LG by an action of the third light-emitting elements 35 and the third coloring layer 81(G).

The dichroic prism 50 (a prism) includes a first incident surface 51, a second incident surface 52 facing the first incident surface 51, a third incident surface 53 provided between the first incident surface 51 and the second incident surface 52, and an emission surface 54 facing the third incident surface 53. The first panel 10 is arranged to face the first incident surface 51, where the first image light LR of red color light being the first color light emitted from the first panel 10 is incident on the first incident surface 51. The second panel 20 is arranged to face the second incident surface 52, and the second image light LB of blue color light being the second color light emitted from the second panel 20 is incident on the second incident surface 52. The third panel 30 is arranged to face the third incident surface 53, and the third image light LG of green color light being the third color light emitted from the third panel 30 is incident on the third incident surface 53. Further, the first incident surface 51 is fixed to the first panel 10 via an adhesive 19 having light-transmissivity, the second incident surface 52 is fixed to the second panel 20 via an adhesive 29 having light-transmissivity, and the third incident surface 53 is fixed to the third panel 30 via an adhesive 39 having light-transmissivity.

The dichroic prism 50 also includes the first dichroic mirror 56 and the second dichroic mirror 57 arranged to intersect each other at 45 degrees angle.

As indicated by a solid line La45 illustrated in FIG. 4, as for the light being incident at 45 degrees angle, for example, the first dichroic mirror 56 transmits light having a wavelength of approximately 550 nm or less and reflects light having a wavelength of approximately 600 nm or greater. Further, as for the light having a wavelength from 550 nm to 600 nm, a longer wavelength lowers the transmittance. Accordingly, the first dichroic mirror 56 reflects the first image light LR toward the emission surface 54 and transmits the second image light LB and the third image light LG.

Further, as indicated by a solid line Lb45 in FIG. 5, as for the light being incident at 45 degrees angle, for example, the second dichroic mirror 57 transmits light having a wavelength of approximately 520 nm or greater and reflects light having a wavelength of approximately 490 nm or less. In addition, as for the light having a wavelength from 490 nm to 520 nm, a longer wavelength increases the transmittance. Accordingly, the second dichroic mirror 57 reflects the second image light LB toward the emission surface 54 and transmits the first image light LR and the third image light LG. Thus, the first image light LR of red color light being the first color light emitted from the first panel 10, the second image light LB of blue color light being the second color light emitted from the second panel 20, and the third image light LG of green color light being the third color light emitted from the third panel 30, are synthesized to be a color image by an action of the first dichroic mirror 56 and the second dichroic mirror 57. The dichroic prism 50 emits the color image from the emission surface 54.

Note that the transmittance and reflectance of the first dichroic mirror 56 are incident angle dependent. For example, as for the first dichroic mirror 56, as indicated by a dashed line La38 illustrated in FIG. 4, the wavelength region of transmission shifts to the longer wavelength side in case of the incident angle being 38 degrees than in case of the incident angle being 45 degrees, and as indicated by a one-dot chain line La52 in FIG. 4, the wavelength region of transmission shifts to the shorter wavelength side in case of the incident angle being 52 degrees than in case of the incident angle being 45 degrees.

Further, as in the first dichroic mirror 56, the transmittance and reflectance of the second dichroic mirror 57 are incident angle dependent. For example, as for the second dichroic mirror 57, as indicated by a dashed line Lb38 illustrated in FIG. 5, the wavelength region of transmission shifts to the longer wavelength side in case of the incident angle being 38 degrees than in case of the incident angle being 45 degrees, and as indicated by a one-dot chain line Lb52 in FIG. 5, the wavelength region of transmission shifts to the shorter wavelength side in case of the incident angle being 52 degrees than in case of the incident angle being 45 degrees.

Electrical Configuration of First Panel 10

Figure 6:
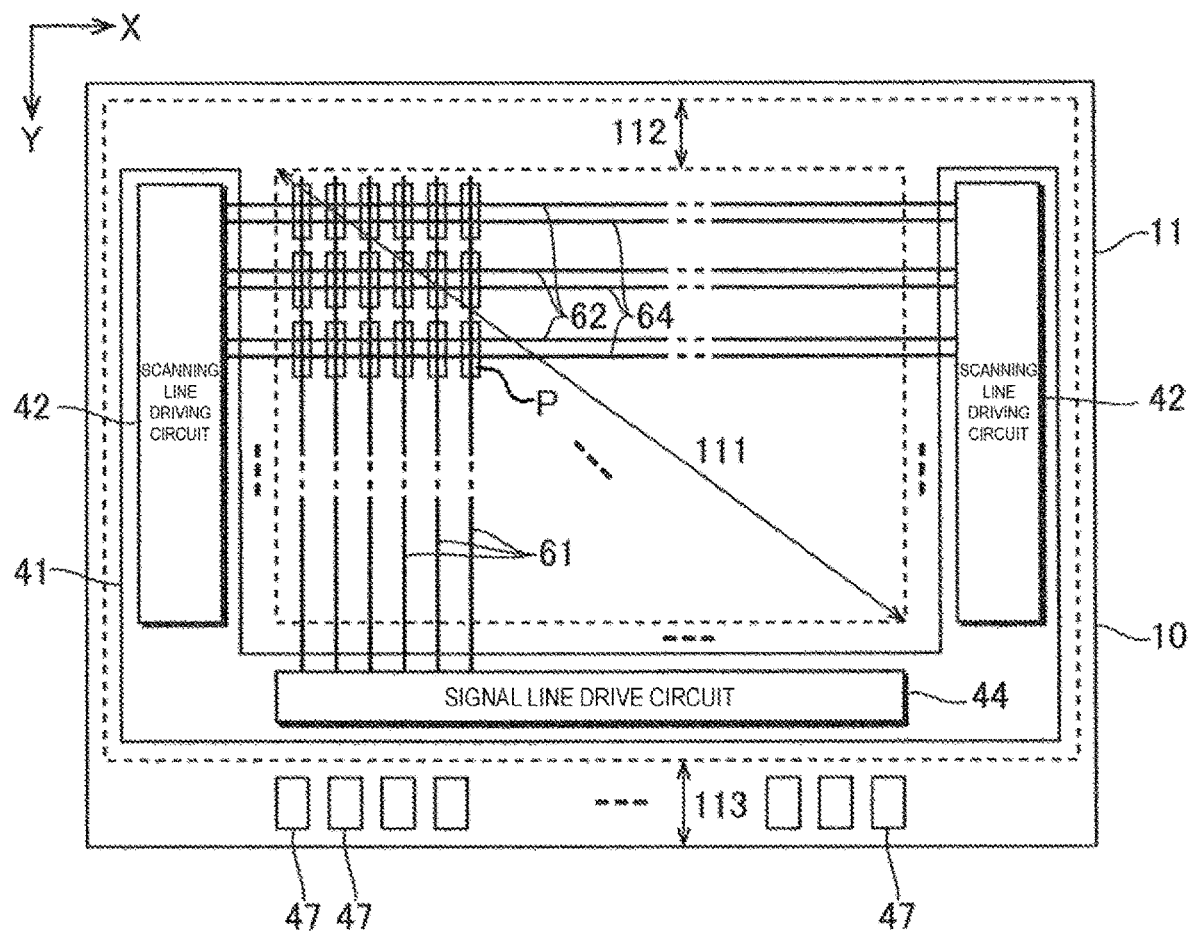
FIG. 6 is an explanatory diagram illustrating an electrical configuration of a first panel illustrated in FIG. 1.
Figure 7:
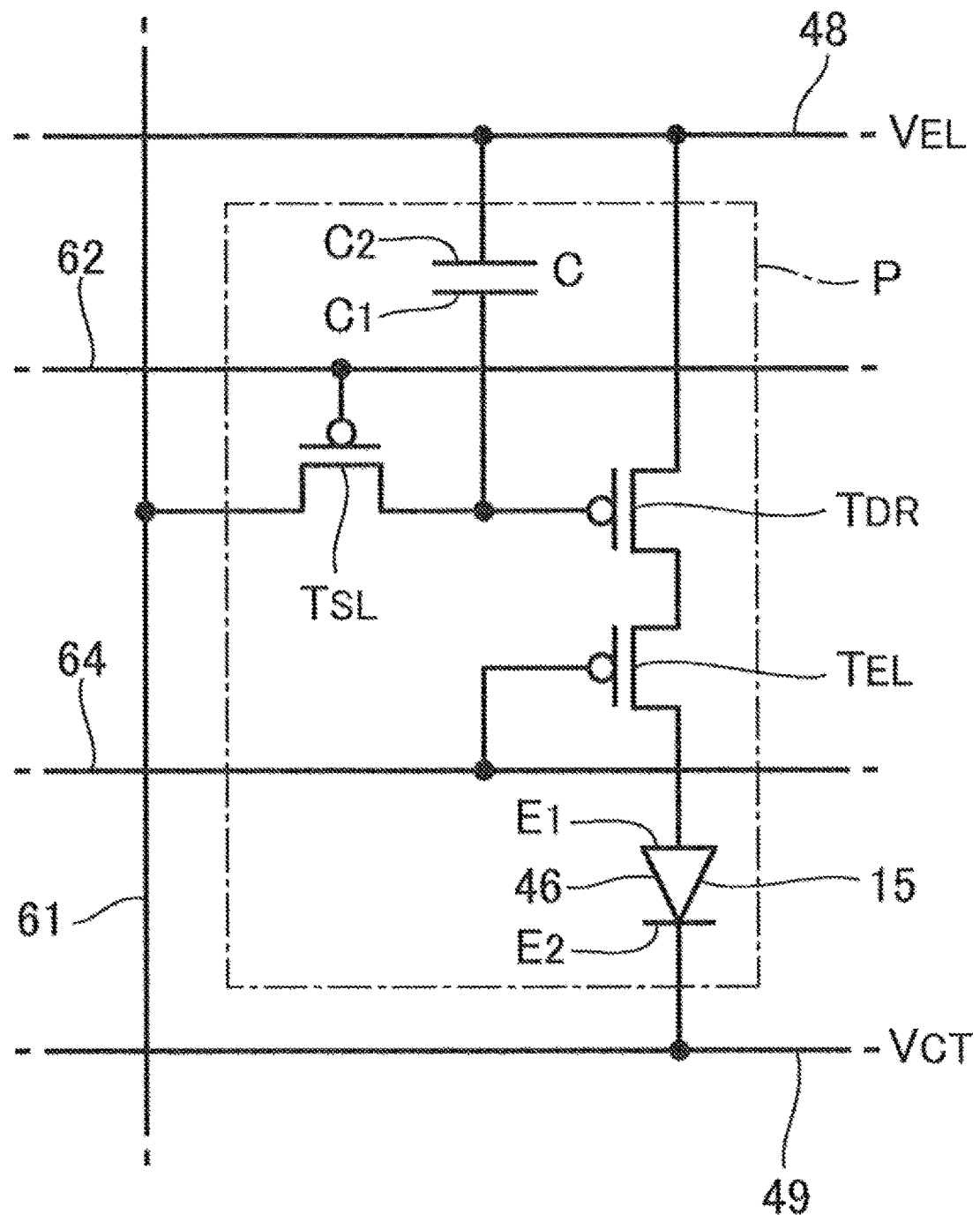
FIG. 7 is a circuit diagram of pixels (pixel circuits) within a first display region illustrated in FIG. 6.

FIG. 6 is an explanatory diagram illustrating an electrical configuration of the first panel 10 illustrated in FIG. 1. FIG. 7 is a circuit diagram of pixels (pixel circuits) within the first display region 111 illustrated in FIG. 6. Note that, for easy understanding of the description, descriptions will be given below assuming that in FIG. 6, the front side of the page is "upper" and the back side of the page is "lower".

As illustrated in FIG. 6, the first panel 10 includes the first display region 111, a peripheral region 112, and a mounting region 113 on the upper surface, that is, one surface of the first substrate 11. In the first embodiment, in the first panel 10, the first substrate 11 is constituted by a semiconductor substrate such as a silicon. In the first substrate 11, the first display region 111 is a rectangular region in which a plurality of pixels P are arrayed. In the first display region 111, there are formed a plurality of scanning lines 62 extending in an X direction, a plurality of control lines 64 extending in the X direction corresponding to the scanning lines 62, and a plurality of signal lines 61 extending in a Y direction intersecting the X direction. The pixels P are formed corresponding to the intersections between the plurality of scanning lines 62 and the plurality of signal lines 61. Accordingly, the plurality of pixels P are arrayed in a matrix pattern, that is, in a lattice pattern across the X direction and the Y direction.

The peripheral region 112 is a rectangular frame-shaped region that surrounds the circumference of the first display region 111. A drive circuit 41 is provided in the peripheral region 112. The drive circuit 41 is a circuit that drives the pixels P within the first display region 111, and is configured to include two scanning line drive circuits 42 and a signal line drive circuit 44. The first panel 10 of the first embodiment is a circuit incorporating display device in which the drive circuit 41 is configured by active elements, such as transistors, formed directly on the surface of the first substrate 11.

The mounting region 113 is a region on the opposite side of the first display region 111 with the peripheral region 112 interposed in between, where a plurality of mounting terminals 47 are arrayed. The mounting terminals 47 are supplied with a control signal and a power supply potential from various external circuits such as a control circuit and a power supply circuit, which are not illustrated. The external circuits are mounted on a non-illustrated flexible circuit board, which is bonded to the mounting region 113, for example.

Further, as illustrated in FIG. 7, the pixel P is configured to include the first light-emitting element 15, a drive transistor TDR, a light emission control transistor TEL, a selection transistor TSL, and a capacitance element C. Note that, although in FIG. 7, the transistors TDR, TEL, and TSL of the pixel P are transistors of P-channel type, transistors of N-channel type may also be used.

The first light-emitting element 15 is an organic EL element, that is, an electro-optical element in which a light-emitting functional layer 46 including a light-emitting layer of an organic EL material is interposed between a first electrode E1 (an anode) and a second electrode E2 (a cathode). The first electrode E1 is formed individually for each of the pixels P, and the second electrode E2 is continuous across the plurality of pixels P. The first light-emitting element 15 is disposed on a current path that couples a first power supply conductor 48 and a second power supply conductor 49. The first power supply conductor 48 is a power supply line to which a higher-side power supply potential (a first potential) VEL is supplied, and the second power supply conductor 49 is a power supply line to which a lower-side power supply potential (a second potential) VCT is supplied.

The drive transistor TDR and the light emission control transistor TEL are arranged on the current path, which couples the first power supply conductor 48 and the second power supply conductor 49, in series with the first light-emitting element 15. Specifically, one (the source) of a pair of current terminals of the drive transistor TDR is coupled to the first power supply conductor 48. The light emission control transistor TEL functions as a switch that controls a conductive state (conductive/non-conductive) between the other (the drain) of the pair of current terminals of the drive transistor TDR, and the first electrode E1 of the first light-emitting element 15. The drive transistor TDR generates a drive current of an amount of the current corresponding to a voltage between the gate and source of the drive transistor TDR. In a state where the light emission control transistor TEL is controlled to be in an ON state, the drive current is supplied from the drive transistor TDR, via the light emission control transistor TEL, to the first light-emitting element 15, to thus cause the first light-emitting element 15 to emit light at a luminance corresponding to the amount of the current of the drive current. In a state where the light emission control transistor TEL is controlled to be in an OFF state, the supply of the drive current to the first light-emitting element 15 is cut off, to thus cause the first light-emitting element 15 to be turned off. The gate of the light emission control transistor TEL is coupled to the control line 64.

The selection transistor TSL functions as a switch that controls a conductive state (conductive/non-conductive) between the signal line 61 and the gate of the drive transistor TDR. The gate of the selection transistor TSL is coupled to the scanning line 62. Further, the capacitance element C is an electrostatic capacitance with a dielectric substance interposed between a first electrode C1 and a second electrode C2. The first electrode C1 is coupled to the gate of the drive transistor TDR, and the second electrode C2 is coupled to the first power supply conductor 48 (the source of the drive transistor TDR). Accordingly, the capacitance element C holds the voltage between the gate and source of the drive transistor TDR.

The signal line drive circuit 44 supplies a grayscale potential that accords with a grayscale specified for each of the pixels P by an image signal supplied from the external circuit, to the plurality of signal lines 61, in parallel, for each of the write periods (horizontal scanning periods). On the other hand, each of the scanning line drive circuits 42 supplies a scanning signal to each of the scanning lines 62, to thus sequentially select each of the plurality of scanning lines 62 for each of the write periods. The selection transistor TSL of the pixels P corresponding to the scanning line 62 selected by the scanning line drive circuit 42 switches to an ON state. Accordingly, the grayscale potential is supplied to the gate of the drive transistor TDR of each of the pixels P, via the signal line 61 and the selection transistor TSL, and a voltage that accords with the grayscale potential is held in the capacitance element C. On the other hand, upon termination of the selection of the scanning lines 62 in the write period, each of the scanning line drive circuits 42 supplies a control signal to each of the control lines 64, to thus control the light emission control transistor TEL of each of the pixels P corresponding to the control line 64 to be in an ON state. Accordingly, a drive current that accords with the voltage held in the capacitance element C in the immediately preceding write period is supplied from the drive transistor TDR, via the light emission control transistor TEL, to the first light-emitting element 15. In this way, the first light-emitting element 15 emits light at a luminance that accords with the grayscale potential, to thus cause the first image light LR arbitrarily specified by the image signal to be emitted from the first display region 111. That is, the first panel 10 having such an electrical configuration causes the first image light LR as desired to be emitted using the plurality of first light-emitting elements 15 singly without using a liquid crystal panel.

Cross-Sectional Configuration of First Panel 10

Figure 8:
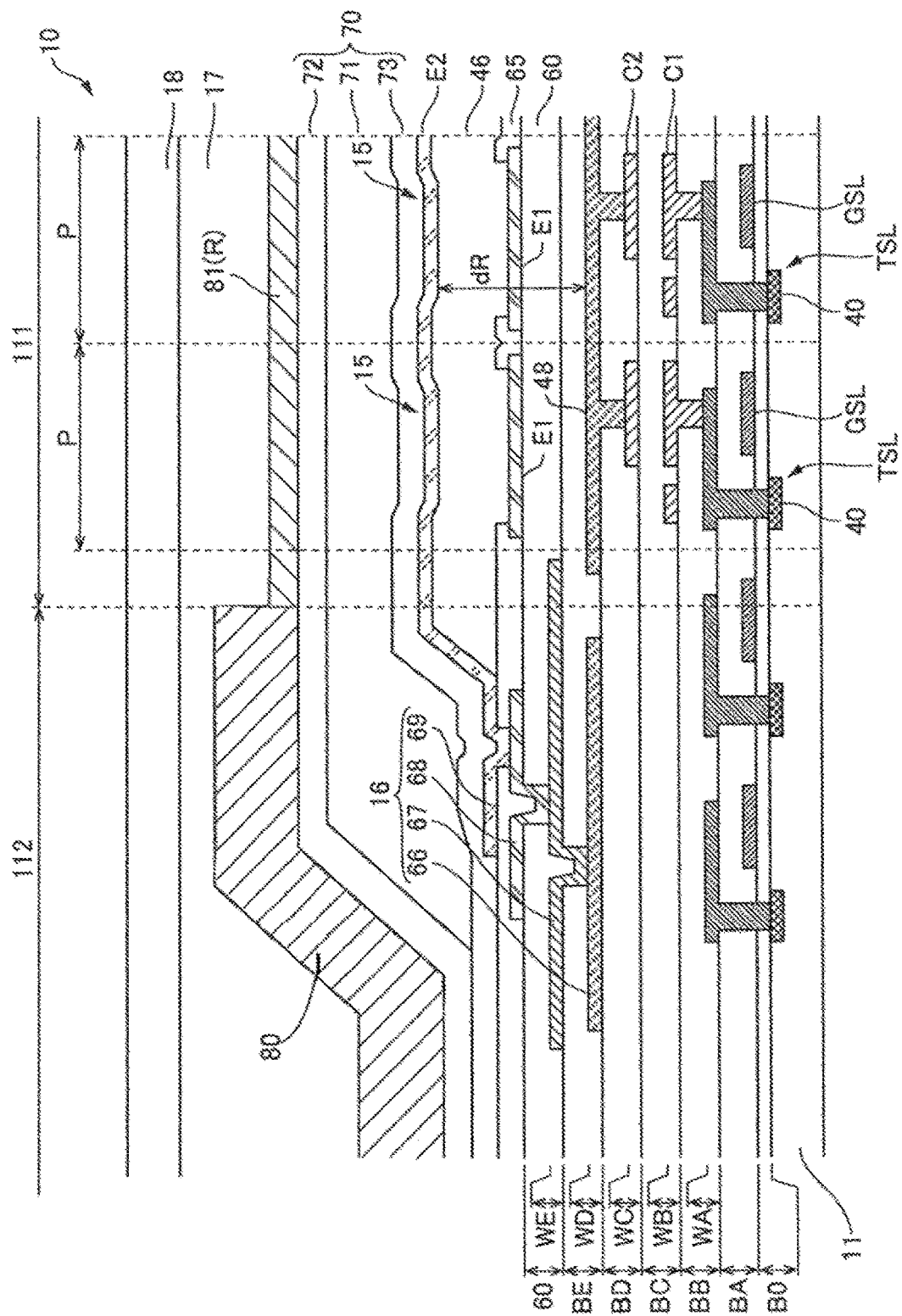
FIG. 8 is a cross-sectional view of a first panel illustrated in FIG. 1.

FIG. 8 is a cross-sectional view of the first panel 10 illustrated in FIG. 1. Note that, for easy understanding of the description, descriptions will be given below assuming that in FIG. 8, the upper side is "upper" and the lower side is "lower".

As illustrated in FIG. 8, an active region 40 (source/drain regions) of a transistor, such as the selection transistor TSL of the pixel P, is formed at the first substrate 11, and the upper surface of the active region 40 is covered by an insulating film B0 (a gate insulating film). A gate electrode GSL is formed at the upper surface of the insulating film B0. On the upper layer side of the gate electrode GSL, a multilayer wiring layer is formed, in which a plurality of insulating layers BA to BE and a plurality of wiring layers WA to WE are alternately layered. Each of the wiring layers is formed of a low-resistance conductive material containing aluminum, silver, or the like. The wiring layer WA including the scanning lines 62 and the like illustrated in FIG. 7 is formed at the upper surface of the insulating layer BA. The wiring layer WB including the signal lines 61, the first electrode C1 and the like illustrated in FIG. 7 is formed at the upper layer of the insulating layer BB. The wiring layer WC including the second electrode C2 and the like illustrated in FIG. 7 is formed at the surface-upper layer of the insulating layer BC. The wiring layer WD including the first power supply conductor 48 and the like illustrated in FIG. 7 is formed at the surface-upper layer of the insulating layer BD. The wiring layer WE including a wiring 69, a wiring 67, and the like is formed at the upper layer of the insulating layer BE. Note that in the first embodiment, a support substrate in the first panel 10 is configured by the first substrate 11, the insulating film B0, the gate electrode GSL, the insulating layers BA to BD, and the wiring layers WA to WC, which are described above.

Here, in the first display region 111, an optical adjustment layer 60 is formed at the upper layer of the insulating layer BE. The optical adjustment layer 60, that is, an optical path adjusting layer is an element that is used to set a resonance wavelength of an optical resonator to an adequate wavelength, and is formed of a light-transmissive insulating material of silicon nitride, silicon dioxide, or the like. Specifically, in the first embodiment, the first power supply conductor 48 being a reflective film (a first reflective film), the insulating layer BE, the optical adjustment layer 60 (a first optical adjustment layer), the first electrode E1 being a transparent electrode, the light-emitting functional layer 46 including a light-emitting layer (a first light-emitting layer), and the second electrode E2 being a semireflective semitransmissive electrode (a first semireflective semitransmissive electrode) configure the optical resonator, that is, the microresonator. An optical path length dR (an optical distance) between the first power supply conductor 48 and the second electrode E2 in the optical resonator is appropriately adjusted in accordance with the film thicknesses of the optical adjustment layer 60 and the first electrode E1. This allows, in the first panel 10, the first color light to be extracted from a side of the second electrode E2, thus setting a resonance wavelength of the light emitted from the first panel 10. Further, in the first embodiment, the first image light LR of red color light being the first color light is emitted from the first panel 10, thus, the optical path length dR of the optical resonator is set to an adequate value, that is, an adequate distance for the first image light LR. In addition, in the first panel 10, the first color light is extracted from the side of the second electrode E2 (a side of the first semireflective semitransmissive electrode), to thus configure the first light-emitting element 15 of a top-emission type.

More specifically, the first electrode E1 is formed at the upper surface of the optical adjustment layer 60, for each of the pixels P within the first display region 111. The first electrode E1, which constitutes a transparent electrode, is formed of a light-transmissive conductive material such as indium tin complex oxide (ITO) or indium zinc complex oxide (IZO), for example. A pixel defining layer 65 having an insulating property is formed around the first electrode E1. The light-emitting functional layer 46 is formed at the upper surface of the first electrode E1. The light-emitting functional layer 46 is constituted by an organic layer (a first organic layer) that includes the light-emitting layer formed containing an organic EL material that emits red color light, and radiates red color light, that is, emits light as a result of a supply of current. Note that the light-emitting functional layer 46 may be constituted by a layered body provided with a transport layer or an injection layer for electrons or positive holes supplied to the light-emitting layer. In the first embodiment, the light-emitting functional layer 46 is formed continuously across the plurality of pixels P within the first display region 111.

The second electrode E2 being a semireflective semitransmissive electrode is formed at the upper layer of the light-emitting functional layer 46, over the entire area of the first display region 111, where in the light-emitting functional layer 46, a region interposed between the first electrode E1 and the second electrode E2 (a light-emitting region) emits light. Further, the second electrode E2 transmits part of the light having reached the second electrode E2, as well as functions as a semireflective semitransmissive layer that reflects the rest. More specifically, a photoreflective conductive material, such as an alloy containing silver or magnesium, is formed into a sufficiently thin film, to thus form the second electrode E2, as a semireflective semitransmissive electrode having semireflective semitransmissive properties. Accordingly, the radiated light from the light-emitting functional layer 46 reciprocates between the first power supply conductor 48 being a reflective film and the second electrode E2 being a semireflective semitransmissive electrode. As a result, the first image light LR of red color light being the first color light as a component of a particular resonance wavelength is selectively amplified and then the reciprocating light passes through the second electrode E2 to be emitted to an observation side (the opposite side from the first substrate 11). That is, the first power supply conductor 48, the insulating layer BE, the optical adjustment layer 60, the first electrode E1, the light-emitting functional layer 46 including a light-emitting layer, and the second electrode E2 form the optical resonator that causes light emitted from the light-emitting functional layer 46 to resonate between the first power supply conductor 48 that functions as a reflective film and the second electrode E2 that functions as a semireflective semitransmissive electrode.

Further, in the present disclosure, it suffices that the optical adjustment layer 60 be composed of a light-transmissive insulating material such as silicon nitride, silicon dioxide, or the like. The optical adjustment layer 60 may be a single layer body containing these materials, or may be a layered body, where when the optical adjustment layer 60 is constituted by the layered body, the optical adjustment layer 60 may also be referred to as optical adjustment layer with the insulating layer BE and the optical adjustment layer 60, including the insulating layer BE.

Moreover, in the peripheral region 112, a metal wiring 16 including wirings 66, 67, 68, and 69, and the like is formed in the same layers as the conductive layers formed in the first display region 111, where the wirings 66, 67, 68, and 69 are electrically coupled via contact holes through insulating layers, which are formed between the wirings, for example.

On the upper layer side of the second electrode E2, a sealing body 70 is formed over the entire area of the first substrate 11. The sealing body 70, which is a light-transmissive film body that seals the elements formed over the first substrate 11 to prevent infiltration of outside air and moisture, is constituted, in the first embodiment, by layered films of a first sealing layer 71, a second sealing layer 72, and a third sealing layer 73. The third sealing layer 73, which is formed at the upper layer of the second electrode E2, is in direct contact with the upper surface of the second electrode E2. The third sealing layer 73 contains an insulating inorganic material such as a silicon compound (typically, silicon nitride or silicon oxide), for example. Further, the first sealing layer 71 functions as a flattening film that buries level differences of the surfaces of the second electrode E2 and the third sealing layer 73. The first sealing layer 71 is formed of a light-transmissive organic material such as an epoxy resin, for example. Moreover, the second sealing layer 72 is formed over the entire area of the first substrate 11. The second sealing layer 72 is formed of a silicon nitride, a silicon oxynitride, or the like, which provides excellent water-resistant and heat-resistant properties, for example.

Further, on the top surface of the sealing body 70 (the second sealing layer 72), in the first display region 111, the first coloring layer 81(R) is formed, and in the peripheral region 112, a blocking layer 80 is formed. This allows, in the first display region 111, the first coloring layer 81(R) to transmit red color light in the first wavelength region, and allows, in the peripheral region 112, the blocking layer 80 to block the red color light in the first wavelength region.

Further, in the first panel 10, a cover substrate 18 having light-transmissivity is fixed, with an adhesive 17, to the first coloring layer 81(R) and the blocking layer 80, on the opposite side of the first substrate 11. This allows the cover substrate 18 to protect the first coloring layer 81(R) and the blocking layer 80.

Moreover, in the first embodiment, in the first panel 10 having such a configuration, the first light-emitting element 15 is constituted, as described above, by an organic EL element in which the light-emitting functional layer 46 including a light-emitting layer of organic EL material is interposed between the first electrode E1 (an anode) and the second electrode E2 (a cathode). The light-emitting functional layer 46 is constituted by a layered body in which a hole transport layer, a light-emitting layer (a red light-emitting layer), an electron transport layer, and an electron injection layer are layered in this order from a side of the first electrode E1 (an anode), for example. Each of the layers constituting the first light-emitting element 15 will be described below.

First Electrode E1 (Anode)

The first electrode E1 (an anode) is an electrode that injects holes into the hole transport layer. As a constituent material of the first electrode E1, a material having a large work function and excellent conductivity may be used.

Examples of the constituent material of the first electrode E1 include, for example, oxides such as Indium Tin Oxide (ITO), Indium Zinc Oxide (IZO), $In_2O_3$, $SnO_2$, Sb-containing $SnO_2$, Al-containing ZnO, Au, Pt, Pt, Ag, Cu, or alloys or the like containing these metals. These can be used in one type or in combination of two types or more.

The average thickness of the first electrode E1 thus configured is not particularly limited, and it is preferred that the thickness range approximately from 10 nm to 200 nm, and it is more preferred that the thickness range approximately from 50 nm to 150 nm.

Second Electrode E2 (Anode)

A second electrode E2 (an anode) is an electrode that injects electrons into an electron transport layer via an electron injection layer. As a constituent material of the second electrode E2, a material having a small work function may be used.

Examples of the constituent material of the second electrode E2 include, for example, Li, Mg, Ca, Sr, La, Ce, Er, Eu, Sc, Y, Yb, Ag, Cu, Al, Cs, Rb, or alloys or the like containing these metals. These can be used in one type or in combination of two types or more (for example, a layered body of multiple layers, and the like).

Hole Transport Layer

The hole transport layer functions to transport holes injected from the first electrode E1 (an anode) to the light-emitting layer.

The constituent material of the hole transport layer is not particularly limited, and examples the constituent material include amine-based compounds such as N,N,N',N'-Tetraphenylbenzidine and its derivatives. These can be used in one type or in combination of two types or more.

Light-Emitting Layer (Red Light-Emitting Layer)

In the first light-emitting element 15, the light-emitting layer is constituted by a red light-emitting layer that emits red-luminous light, and is configured to include a red luminescent material that emits red color light, and a host material that holds the red luminescent material, for example.

Such a red luminescent material is not particularly limited, and for the red luminescent material, various types of red fluorescent materials and red phosphorescent materials can be used in one type or in combination of two types or more.

Examples of the red fluorescent material include, without being particularly limited as long as being a material that emits red fluorescent light, perylene derivatives such as a tetraaryldiindenoperylene derivative, europium complexes, benzopyran derivatives, rhodamine derivatives, benzothioxanthene derivatives, porphyrin derivatives, nile red, 4-(dicyanomethylene)-2-tert-butyl-6-(1,1,7,7-tetramethyljulolidin-4-yl-vinyl)-4H-pyran (DCJTB), (E)-2-(2-(4-(dimethylamino)styryl)-6-methyl-4H-pyran-4-ylidene) malononitrile (DCM), and the like.

Examples of the red phosphorescent material include, without being particularly limited as long as being a material that emits red phosphorescent light, metal complexes such as iridium, ruthenium, platinum, osmium, rhenium, and palladium. The metal complexes may also have at least one ligand having a phenylpyridine backbone, bipyridyl backbone, porphyrin backbone, or the like. More specific examples of the red phosphorescent material include tris(1-phenylisoquinoline)iridium, bis(2-benzo[b]thiophen-2-yl-pyridine) (acetylacetonate)iridium(III) ($Ir(btp)_2(acac)$), 2,3,7,8,12,13,17,18-octaethyl-21H,23H-porphine platinum (PtOEP).

The host material is not particularly limited as long as exhibiting the aforementioned function with respect to the red luminescent material that is used, however, when the red luminescent material contains the red fluorescent material, examples of the host material include anthracene derivatives such as that represented by Formula (6) below, acene derivatives (acene-based compounds) such as anthracene derivatives, which is, for example, 3-tert-butyl-9,10-di(naphth-2-yl)anthracene (TBADN) and tetracene derivatives represented by Formula (3) below, distyrylarylene derivatives, perylene derivatives, distyrylbenzene derivatives, distyrylamine derivatives, quinolinolate-based metal complexes such as a tris(8-quinolinolato) aluminum complex ($Alq_3$), triarylamine derivatives such as a tetramer of triphenylamine, oxadiazole derivatives, silole derivatives, dicarbazole derivatives, oligothiophene derivatives, benzopyran derivatives, triazole derivatives, benzoxazole derivatives, benzothiazole derivatives, quinoline derivatives, and 4,4'-bis(2,2-diphenylvinyl)biphenyl (DPVBi). These can be used in one type singly or in combination of two types or more.

[Formula 1]

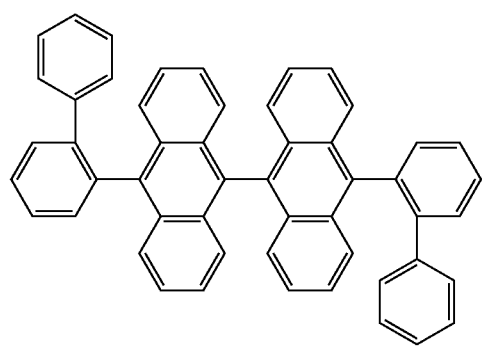

(6)

-continued

[Formula 2]

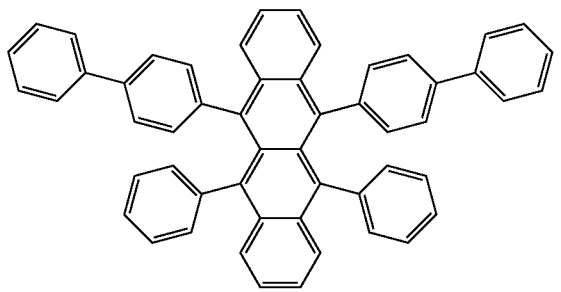

(3)

Further, when the red luminescent material contains the red phosphorescent material, examples of the host material include carbazole derivatives such as 4,4'-bis(carbazol-9-yl) biphenyl (CBP). These can be used in one type singly or in combination of two types or more.

Electron Transport Layer

The electron transport layer functions to transport electrons injected from the second electrode E2 (a cathode) via the electron injection layer, to the light-emitting layer.

Examples of the constituent material of the electron transport layer (an electron transport material) include phenanthroline derivatives such as 2,9-dimethyl-4,7-diphenyl-1,10-phenanthroline (BCP), and quinoline derivatives such as organometallic complexes having 8-quinolinol or its derivative as a ligand, for example, tris(8-hydroxy-quinolinato)aluminium ($Alq_3$)), azaindolizine derivatives, oxadiazole derivatives, perylene derivatives, pyridine derivatives, pyrimidine derivatives, quinoxaline derivatives, diphenylquinone derivatives, and nitro-substituted fluorene derivatives. These can be used in one type or in combination of two types or more.

Electron Injection Layer

The electron injection layer functions to improve electron injection efficiency from the second electrode E2 (a cathode).

Examples of the constituent material of the electron injection layer (an electron injection material) include various types of inorganic insulating materials and various types of inorganic semiconductor materials.

Examples of such an inorganic insulating material include alkali metal chalcogenides (oxides, sulfides, selenides, tellurides), alkaline earth metal chalcogenides, and alkali metal halides and alkaline earth metal halides. These can be used in one type or in combination of two types or more. Configuring the electron injection layer with the above as the main material makes it possible to further improve the electron injection properties. In particular, alkali metal compounds (alkali metal chalcogenides, alkali metal halides, and the like) have an extremely small work function, and by using these to configure the electron injection layer, the light-emitting element achieves high luminance.

Examples of the alkali metal chalcogenides include $Li_2O$, LiO, $Na_2S$, $Na_2Se$, and NaO.

Examples of the alkaline earth metal chalcogenides include CaO, BaO, SrO, BeO, BaS, MgO, and CaSe.

Examples of the alkali metal halides include CsF, LiF, NaF, KF, LiCl, KCl, and NaCl.

Examples of the alkaline earth metal halides include $CaF_2$, $BaF_2$, $SrF_2$, $MgF_2$, and $BeF_2$.

Further, examples of the inorganic semiconductor materials include oxides, nitrides, or oxynitrides including at least one element from among Li, Na, Ba, Ca, Sr, Yb, Al, Ga, In, Cd, Mg, Si, Ta, Sb, and Zn. These can be used in one type or in combination of two types or more.

Configurations of Second Panel 20 and Third Panel 30

Figure 9:
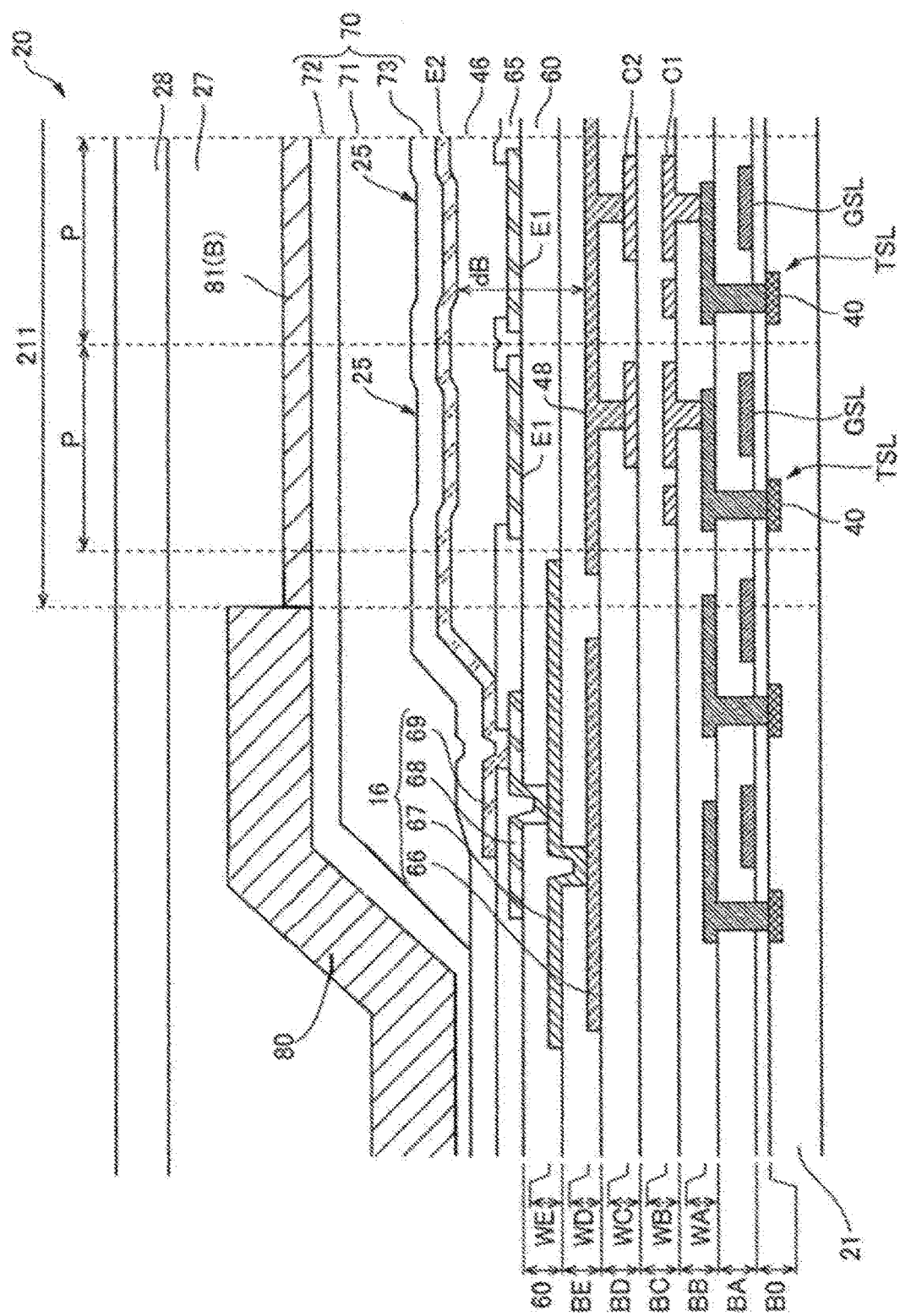
FIG. 9 is a cross-sectional view of a second panel illustrated in FIG. 1.
Figure 10:
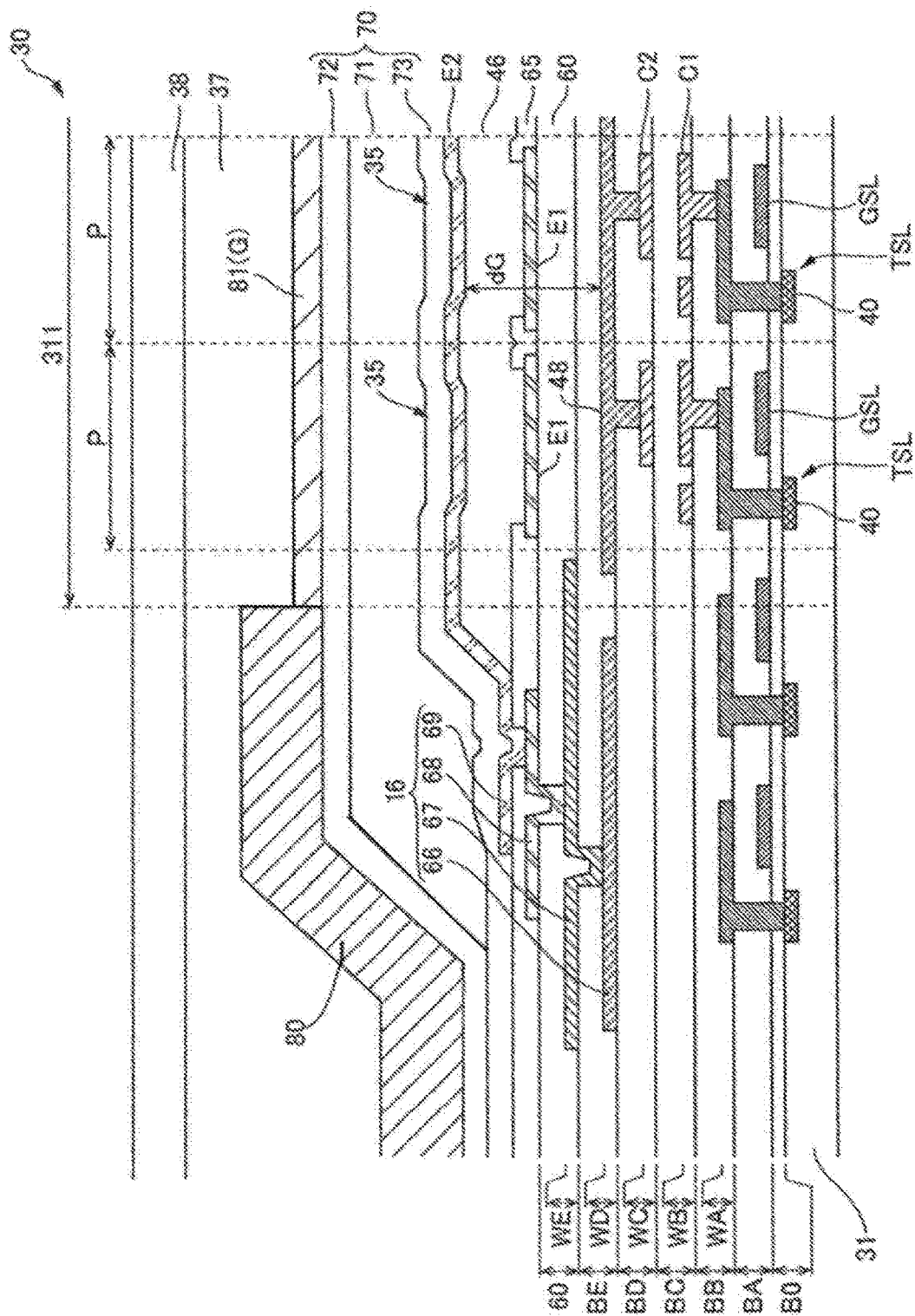
FIG. 10 is a cross-sectional view of a third panel illustrated in FIG. 1.

FIG. 9 is a cross-sectional view of the second panel 20 illustrated in FIG. 1. FIG. 10 is a cross-sectional view of the third panel 30 illustrated in FIG. 1. Note that, for easy understanding of the description, descriptions will be given below assuming that in FIGS. 9 and 10, the upper side is "upper" and the lower side is "lower".

The second panel 20 and the third panel 30 illustrated in FIG. 1 have the electrical configuration illustrated in FIGS. 6 and 7 as in the first panel 10. As illustrated in FIGS. 9 and 10, the second panel 20 and the third panel 30 include, in place of the plurality of first light-emitting element 15, the plurality of second light-emitting elements 25 that emit blue image light by including the light-emitting functional layer 46 constituted by an organic layer (a second organic layer) including a light-emitting layer (a blue light-emitting layer) formed containing an organic EL material that emits blue color light, and the plurality of third light-emitting elements 35 that emit green image light by including the light-emitting functional layer 46 constituted by an organic layer (a third organic layer) including a light-emitting layer (a green light-emitting layer) formed containing an organic EL material that emits green color light, respectively.

Note that the light-emitting layer (a blue light-emitting layer) included in the light-emitting functional layer 46 that is included in the second light-emitting element 25 and the light-emitting layer (a green light-emitting layer) included in the light-emitting functional layer 46 that is included in the third light-emitting element 35 are each configured as described below, for example.

Blue Light-Emitting Layer

The blue light-emitting layer is configured to include a blue luminescent material that emits blue color light, and a host material that holds the blue luminescent material.

Such a blue luminescent material is not particularly limited, and for the blue luminescent material, various blue fluorescent materials and blue phosphorescent materials can be used in one type or in combination of two types or more.

Examples of the blue fluorescent material include, without being particularly limited as long as being a material that emits blue fluorescent light, distyrylamine derivatives such as distyryldiamine compounds, fluoranthene derivatives, pyrene derivatives, perylene and perylene derivatives, anthracene derivatives, benzoxazole derivatives, benzothiazole derivatives, benzimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl (BCzVBi), poly[{9,9-dioctylfluorenyl-2,7-diyl}-co-{1,4-(2,5-dimethoxy)benzene}], poly[{9,9-dihexyloxyfluorene-2,7-diyl}-ortho-co-(2-methoxy-5-{2-ethoxyhexyloxy}phenylene-1,4-diyl], poly[{9,9-dioctylfluorenyl-2,7-diyl}-co-{ethynylbenzene}]. These can be used in one type singly or in combination of two types or more.

Examples of the blue phosphorescent material include, without being particularly limited as long as being a material that emits blue phosphorescent light, metal complexes such as iridium, ruthenium, platinum, osmium, rhenium, and palladium. More specific examples of the blue phosphorescent material include bis[2-(4,6-difluorophenyl)pyridinato-N,C2'](picolinate)iridium(III) (Firpic), tris[2-(4,6-difluorophenyl)pyridinato-N,C2')]iridium(III) (Ir(Fppy)$_3$), bis[2-(3, 5-trifluorometyl)pyridinato-N,C2'](picolinate)iridium(III), bis[2-(4,6-difluorophenyl)pyridinato-N,C2'](acetylacetonate)iridium(III).

As the host material, a host material being the same as that described as the host material of the red light-emitting layer can be used, and among these, acene-based compounds are favorably used.

Green Light-Emitting Layer

The green light-emitting layer is configured to include a green luminescent material that emits green color light, and a host material (a third host material) that holds the green luminescent material.

Such a green luminescent material is not particularly limited, and for the green luminescent material, various green fluorescent materials and green phosphorescent materials can be used in one type or in combination of two types or more.

Examples of the green fluorescent material include, without being particularly limited as long as being a material that emits green fluorescent light, coumarin derivatives, quinacridone and its derivatives such as quinacridone derivatives, 9,10-bisi[9-ethyl-3-carbazoyl)-vinylenyl)]-anthracene, poly (9,9-dihexyl-2,7-vinylenefluorene), poly[(9,9-dioctylfluorene-2,7-diyl)-co-(1,4-diphenylene-vinylene-2-methoxy-5-(2-ethylhexyloxy)benzen)], poly[(9,9-dioctyl-2,7-divinylenefluorene)-oltho-co-(2-methoxy-5-(2-ethoxyloxy-1,4-phenylene)]. These can be used in one type singly or in combination of two types or more.

Examples of the green phosphorescent material include, without being particularly limited as long as being a material that emits green phosphorescent light, metal complexes such as iridium, ruthenium, platinum, osmium, rhenium, and palladium. Among those, the metal complexes having at least one ligand having a phenylpyridine backbone, bipyridyl backbone, porphyrin backbone, or the like are favorably used. More specific examples of the green phosphorescent material include tris(2-phenylpyridinato)iridium (III) (Ir(ppy)$_3$), bis(2-phenylpyridine) (acetylacetonate)iridium(III) (Ir(ppy)$_2$(acac)), tris{5-fluoro-2-[5-(trifluoromethyl)-2-pyridinyl]phenyl}iridium.

As the host material, a host material being the same as that described as the host material of the red light-emitting layer can be used, and among these, acene-based compounds are favorably used.

Further, as illustrated in FIG. 9, in the second panel 20, in place of the first coloring layer 81(R) described with reference to FIG. 8, the second coloring layer 81(B) is formed, where the second coloring layer 81(B) selectively allows the blue color light in the second wavelength region to pass through the second coloring layer 81(B). Further, the film thicknesses of the optical adjustment layer 60 and the first electrode E1 illustrated in FIG. 9 is adjusted to correspond to the wavelength of the second image light LB of blue color emitted from the second panel 20, and in the optical resonator, an optical path length dB (an optical distance) between the first power supply conductor 48 that functions as a reflective film and the second electrode E2 that functions as a semireflective semitransmissive electrode is optimized. Further, in the second panel 20, a cover substrate 28 having light-transmissivity is fixed, with an adhesive 27, to the second coloring layer 81(B), on the opposite side of the second substrate 21.

Moreover, as illustrated in FIG. 10, in the third panel 30, in place of the first coloring layer 81(R) described with reference to FIG. 8, the third coloring layer 81(G) is formed, where the third coloring layer 81(G) selectively allows the green color light in the third wavelength region to pass through the third coloring layer 81(G). Further, the film thicknesses of the optical adjustment layer 60 and the first electrode E1 illustrated in FIG. 10 is adjusted to correspond to the wavelength of the third image light LG of green color emitted from the third panel 30, and in the optical resonator, an optical path length dG (an optical distance) between the first power supply conductor 48 that functions as a reflective film and the second electrode E2 that functions as a semireflective semitransmissive electrode is optimized. In addition, in the third panel 30, a cover substrate 38 having light-transmissivity is fixed, with an adhesive 37, to the third coloring layer 81(G), on the opposite side of the third substrate 31.

Note that the support substrate, the reflective film, the optical adjustment layer 60, the transparent electrode, the light-emitting layer, and the semireflective semitransmissive electrode included in the second panel 20, may be referred to as second support substrate, second reflective film, and second optical adjustment layer, second transparent electrode, second light-emitting layer, and second semireflective semitransmissive electrode, respectively. In the second light-emitting layer, the second color light is extracted from the side of the second electrode E2 (a side of the second semireflective semitransmissive electrode). Further, the support substrate, the reflective film, the optical adjustment layer 60, the transparent electrode, the light-emitting layer, and the semireflective semitransmissive electrode included in the third panel 30, may be referred to as second support substrate, third reflective film, third optical adjustment layer, third transparent electrode, third light-emitting layer, and third semireflective semitransmissive electrode, respectively. In the third panel 30, the third color light is extracted from the side of the second electrode E2 (a side of the third semireflective semitransmissive electrode).

Incidentally, in the image display device 1 configured as described above, in the first panel 10, the optical adjustment layer 60 and the first electrode E1 included in the plurality of first light-emitting elements 15 is adjusted in film thickness to correspond to the wavelength of the first image light LR of red color. Further, in the second panel 20, the optical adjustment layer 60 and the first electrode E1 included in the plurality of second light-emitting elements 25 is adjusted in film thickness to correspond to the wavelength of the second image light LB of blue color. Moreover, in the third panel 30, the optical adjustment layer 60 and the first electrode E1 included in the plurality of third light-emitting elements 35 is adjusted in film thickness to correspond to the wavelength of the third image light LG of green color. As such, the wavelength regions of the image light to be emitted from the plurality of first light-emitting elements 15, the plurality of second light-emitting elements 25, and the plurality of third light-emitting elements 35 differ from one another. Accordingly, at least one of the sums of the thickness of the optical adjustment layer 60 and the thickness of the first electrode E1 in the plurality of first light-emitting elements 15, the plurality of second light-emitting elements 25, and the plurality of third light-emitting elements 35 differs from the other. That is, at least one of a first lamination thickness, which is the sum of the thickness of the optical adjustment layer 60 and the thickness of the first electrode E1 in the plurality of first light-emitting elements 15, a second lamination thickness, which is the sum of the thickness of the optical adjustment layer 60 and the thickness of the first electrode E1 in the plurality of second light-emitting elements 25, and a third lamination thickness, which is the sum of the thickness of the optical adjustment layer 60 and the thickness of the first electrode E1 in the plurality of third light-emitting elements 35, differs from the other.

As such, the optical adjustment layer 60 and the first electrode E1 in the plurality of first light-emitting elements 15, the plurality of second light-emitting elements 25, and the plurality of third light-emitting elements 35 are appropriately set in size of film thickness, to thus optimize the optical path length dR (an optical distance) between the first power supply conductor 48 and the second electrode E2 in the optical resonator of the plurality of first light-emitting elements 15. This allows the first image light LR of red color having a peak in the first color region to be emitted in a reliable manner. Further, this allows, in the optical resonator of the plurality of second light-emitting elements 25, the optical path length dB (an optical distance) between the first power supply conductor 48 and the second electrode E2 to be optimized, thus causing the second image light LB of blue color having a peak in the second color region to be emitted in a reliable manner. Moreover, this allows, in the optical resonator of the plurality of third light-emitting elements 35, the optical path length dG (an optical distance) between the first power supply conductor 48 and the second electrode E2 to be optimized, thus causing the third image light LG of green color having a peak in the third color region to be emitted in a reliable manner. That is, the optical adjustment layer 60 and the first electrode E1 in the plurality of first light-emitting elements 15, the plurality of second light-emitting elements 25, and the plurality of third light-emitting elements 35 are appropriately set in size of film thickness, to thus set the optical path length dR, the optical path length dB, and the optical path length dG between the first power supply conductor 48 and the second electrode E2 to a desired distance.

Further, as described above, the film thicknesses of the optical adjustment layer 60 and the first electrode E1, that is, the sum of the thickness of the optical adjustment layer 60 and the thickness of the first electrode E1 are adjusted to appropriately set the optical path lengths dR, dB, and dG between the first power supply conductor 48 and the second electrode E2 in the optical resonator. Accordingly, this allows, in the first panel 10, the second panel 20, and the third panel 30, an error in the thicknesses of the light-emitting functional layers 46, that is, the organic layers (the first organic layer, the second organic layer, and the third organic layer) included in the first light-emitting element 15, the second light-emitting element 25, and the third light-emitting element 35, which are included in the first panel 10, the second panel 20, and the third panel 30, respectively, to be set within approximately ±20% or less, and more favorably, to be set to be identical. The error in the thicknesses of the light-emitting functional layer 46 can be set to be not greater than such an upper limit value, thus, the driving voltage for driving the first light-emitting element 15, the second light-emitting element 25, and the third light-emitting element 35 can be set to be approximately identical. Accordingly, in the first panel 10, the second panel 20, and the third panel 30, the capacitance elements C included in the first panel 10, the second panel 20, and the third panel 30 can be used as an identical element without altering the elements, to thus prevent the configurations of the first panel 10, the second panel 20, and the third panel 30 from being complexed in a more reliable manner. The thicknesses of the light-emitting functional layers 46, that is, the organic layers included in the first light-emitting element 15, the second light-emitting element 25, and the third light-emitting element 35 can be set in accordance with the light-emitting characteristics required for the first light-emitting element 15, the second light-emitting element 25, and the third light-emitting element 35, respectively. This more reliably prevents an increase of the power consumption of the image display device 1 and a short-circuiting in the light-emitting functional layers 46 that occur due to the higher driving voltage in driving the first light-emitting element 15, the second light-emitting element 25, and the third light-emitting element 35.

Moreover, the film thicknesses of the optical adjustment layer 60 and the first electrode E1, that is, the sum of the thickness of the optical adjustment layer 60 and the thickness of the first electrode E1, may be adjusted to make the sum of the thickness of the optical adjustment layer 60 and the thickness of the first electrode E1 set greater than the thicknesses of the light-emitting functional layers 46, that is, the organic layers. As such, the sum of the thickness of the optical adjustment layer 60 and the thickness of the first electrode E1 are adjusted to set the optical path lengths dR, dB, and dG between the first power supply conductor 48 and the second electrode E2 to desired sizes, to thus cause the thicknesses of the light-emitting functional layers 46 to be set thinner than the sum of the thickness of the optical adjustment layer 60 and the thickness of the first electrode E1, in view of luminous efficiency of the light-emitting functional layers 46. This allows the first light-emitting element 15, the second light-emitting element 25, and the third light-emitting element 35 to be configured by light-emitting elements that can perform low voltage driving.

Further, in adjusting the sum of the film thicknesses of the optical adjustment layer 60 and the first electrode E1, that is, the sum of the thickness of the optical adjustment layer 60 and the thickness of the first electrode E1, the film thicknesses of the first electrodes E1 (the first transparent electrode, the second transparent electrode, and the third transparent electrode) included in each of the first light-emitting element 15, the second light-emitting element 25, and the third light-emitting element 35 may be identical, and further, the film thicknesses of these first electrodes E1 may be thinner than the film thicknesses of the optical adjustment layers 60 (the first optical adjustment layer, the second optical adjustment layer, and the third optical adjustment layer). That is, the film thickness of the optical adjustment layer 60 may be greater than the film thickness of the first electrode E1. Satisfying the relationship in film thickness makes it possible to suppress an absorption of the image light LR, LB, and LG in the first electrode E1 in an accurate manner. In addition, the driving voltage in driving the first light-emitting element 15, the second light-emitting element 25, and the third light-emitting element 35 can be set to be approximately identical in size in a relatively easy manner.

Further, as described above, it suffices that the optical adjustment layer 60 be composed of a light-transmissive insulating material such as silicon nitride, silicon dioxide, or the like. The optical adjustment layer 60 may be a single layer body or a layered body, which contains these materials, where when the optical adjustment layer 60 is constituted by the layered body, the optical adjustment layer 60 may also be referred to as optical adjustment layer with the insulating layer BE and the optical adjustment layer 60, including the insulating layer BE, however, the optical adjustment layers may each be constituted by a layered body of two or more layers. This accurately suppresses or prevents a generation of strain in the panels 10, 20, and 30 due to an occurrence of stress in the layered body constituted by the insulating layer BE and the optical adjustment layer 60.

Further, when the first electrode E1 is composed of ITO and the optical adjustment layer 60 is constituted by a single layer body, the optical adjustment layer 60 may be composed of silicon dioxide, and when the optical adjustment layer 60 is constituted by a layered body, the uppermost layer of the optical adjustment layer 60 may be composed of silicon dioxide. This allows the wavelength dispersion of the refractive index at the interface between the first electrode E1 and the optical adjustment layer 60 to be minimized, thus enhancing the light-extraction efficiency. Moreover, when the optical adjustment layer 60 is constituted by a layered body, the uppermost layer of the optical adjustment layer 60 is composed of silicon dioxide, and the lower layer of the uppermost layer may be composed of silicon nitride. This allows the lower layer to function as an etching stop layer in depositing the uppermost layer as a patterned layer.

Note that in the first embodiment, descriptions are given about cases in which in the first panel 10, the second panel 20, and the third panel 30, red color light, blue color light, and green color light emitted from the first light-emitting element 15, the second light-emitting element 25, and the third light-emitting element 35 are caused to pass through, as image light in the respective wavelength regions, the first coloring layer 81(R), the second coloring layer 81(B), and the third coloring layer 81(B), respectively, and the first panel 10, the second panel 20, and the third panel 30 include the optical resonator and the coloring layer, the present disclosure is not limited to such cases, and for example, the first panel 10, the second panel 20, and the third panel 30 may also be a panel in which the formation of the coloring layer is omitted. Further, each of the first light-emitting element 15, the second light-emitting element 25, and the third light-emitting element 35 may also be a light-emitting element that emits white light.

In addition, in the first embodiment, descriptions are given about cases in which the first panel 10, the second panel 20, and the third panel 30 include the cover substrate 18, the cover substrate 28, and the cover substrate 38, respectively, and the first panel 10, the second panel 20, and the third panel 30 may also be panels in which the formations of the cover substrate 18, the cover substrate 28, and the cover substrate 38 are omitted.

The image display device 1 configured as described above can be incorporated into various virtual image display apparatuses.

Eyeglass Display

Hereinafter, an eyeglass display including the image display device 1 will be described below as an example of the virtual image display apparatus of the present disclosure.

Figure 11:
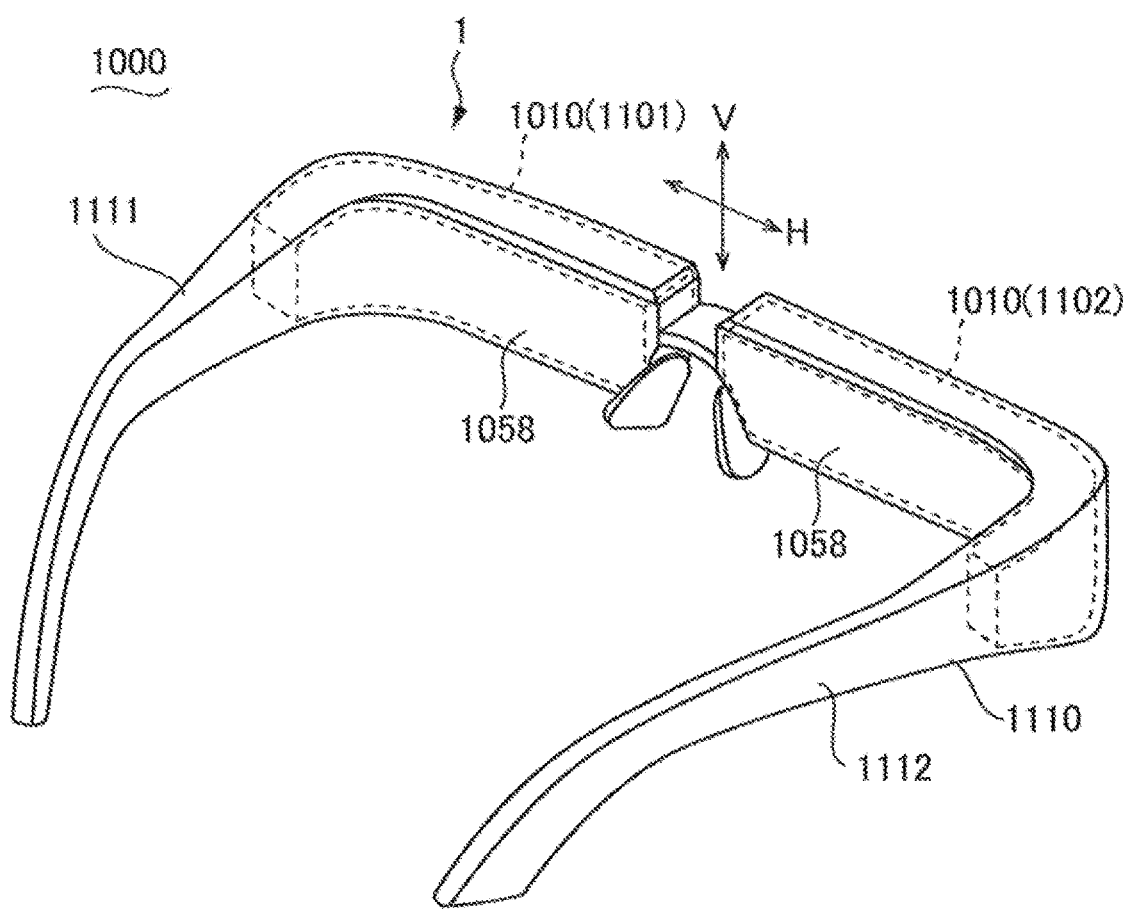
FIG. 11 is an explanatory view of a virtual image display apparatus of a head-mounted type.
Figure 12:
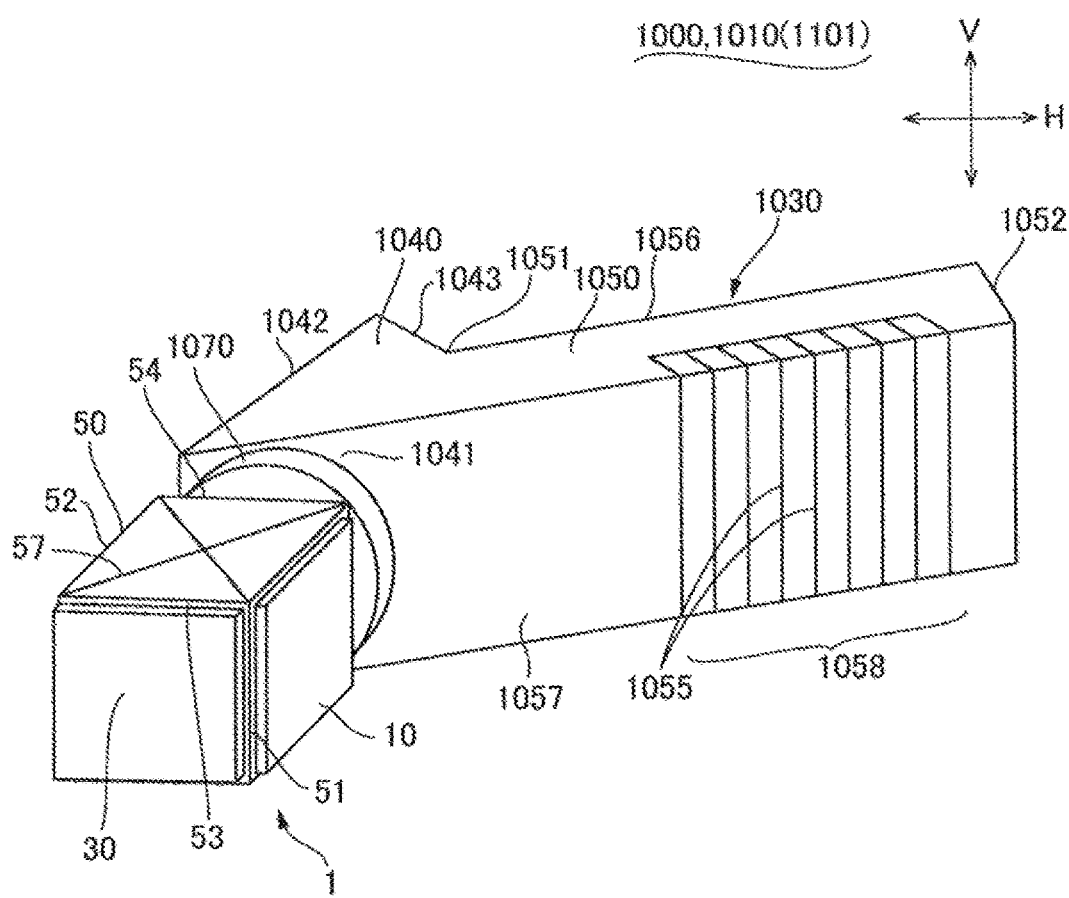
FIG. 12 is a perspective view schematically illustrating a configuration of an optical system of a virtual display unit illustrated in FIG. 11.
Figure 13:
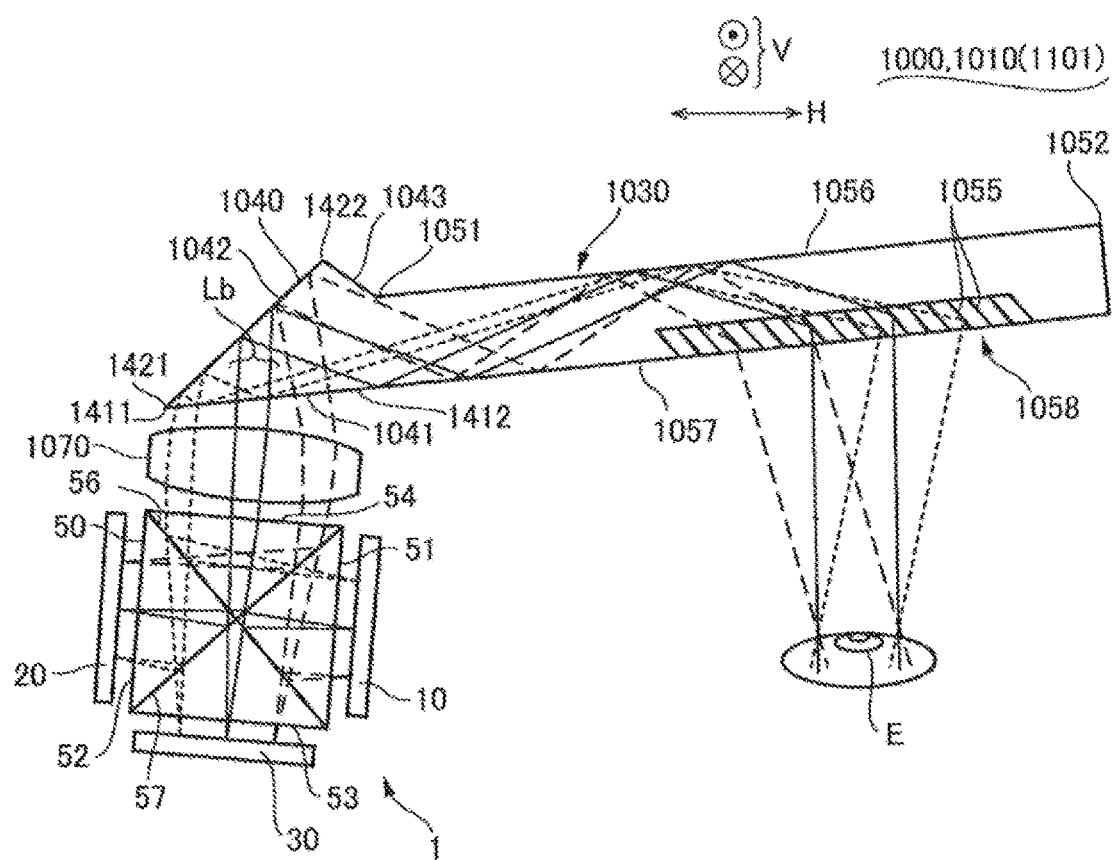
FIG. 13 is an explanatory view illustrating optical paths in an optical system illustrated in FIG. 12.

FIG. 11 is an explanatory view of a virtual image display apparatus of a head-mounted type. FIG. 12 is a perspective view schematically illustrating a configuration of an optical system of virtual display unit 1010 illustrated in FIG. 11. FIG. 13 is an explanatory view illustrating optical paths of the optical system illustrated in FIG. 12.

As illustrated in FIG. 11, a virtual image display apparatus 1000 is configured as an eyeglass display of a see-through type, that is, a head-mounted display of an augmented reality (AR) type, and includes a frame 1110 provided with temples 1111 and 1112 at right and left portions.

The virtual image display apparatus 1000, in which the virtual display units 1010 are supported by the frame 1110, allows the user to recognize an image emitted from the virtual display units 1010 as a virtual image.

In the second embodiment, the virtual image display apparatus 1000 includes a left-eye display unit 1101 and a right-eye display unit 1102 as the virtual display units 1010.

The left-eye display unit 1101 and the right-eye display unit 1102, which have an identical configuration, are disposed right-left symmetrically.

The left-eye display unit 1101 will be mainly described below, and descriptions of the right-eye display unit 1102 will not be given.

As illustrated in FIG. 12, in the virtual image display apparatus 1000, the display unit 1101 includes the image display device 1, and a light guiding system 1030 that guides synthesized light Lb emitted from the image display device 1 to an emission portion 1058. A projection lens system 1070 is disposed between the image display device 1 and the light guiding system 1030, and the synthesized light Lb emitted from the image display device 1 is incident on the light guiding system 1030 via the projection lens system 1070. The projection lens system 1070 is configured by a single collimate lens having a positive power.

The light guiding system 1030 includes an incident portion 1040 having light-transmissivity on which the synthesized light Lb is incident, and a light guide portion 1050 having light-transmissivity, one end 1051 side of which is coupled to the incident portion 1040. In the second embodiment, the incident portion 1040 and the light guide portion 1050 are configured as an integrated transmissive member.

The incident portion 1040 includes an incident surface 1041 on which the synthesized light Lb emitted from the image display device 1 is incident, and a reflection surface 1042 that reflects the synthesized light Lb being incident from the incident surface 1041, the synthesized light Lb being reflected between the reflection surface 1042 and the incident surface 1041.

As illustrated in FIG. 13, the incident surface 1041, which is a flat surface, an aspherical surface, a free form surface, or the like, faces the image display device 1 via the projection lens system 1070. The projection lens system 1070 is disposed obliquely such that the spacing between the projection lens system 1070 and an end portion 1412 of the incident surface 1041 is larger than the spacing between the projection lens system 1070 and an end portion 1411 of the incident surface 1041. A reflection film or the like is not formed at the incident surface 1041, and the incident surface 1041 fully reflects light being incident at an incident angle not less than a critical angle. Accordingly, the incident surface 1041 has a light-transmissive property and a light reflecting property.

The reflection surface 1042, which is a surface facing the incident surface 1041, and is disposed obliquely such that an end portion 1422 of the reflection surface 1042 is spaced apart farther from the incident surface 1041 than from an end portion 1421 of the incident surface 1041. Accordingly, the incident portion 1040 has a substantially triangular shape. The reflection surface 1042 is a flat surface, an aspherical surface, a free form surface, or the like. The reflection surface 1042 can employ a configuration in which a reflective metal layer, mainly formed of aluminum, silver, magnesium, chrome or the like, is formed.

The light guide portion 1050 includes a first surface 1056 (a first reflection surface) extending from one end 1051 to other end 1052 side, a second surface 1057 (a second reflection surface) facing and extends in parallel to the first surface 1056 from the one end 1051 side to the other end 1052 side, and the emission portion 1058 provided at a portion of the second surface 1057, which is spaced apart from the incident portion 1040.

The first surface 1056, and the reflection surface 1042 of the incident portion 1040 are joined together via an inclined surface 1043. The film thicknesses of the first surface 1056 and the second surface 1057 are thinner than the incident portion 1040. The first surface 1056 and the second surface 1057 reflect all the light being incident at an incident angle not less than the critical angle, based on a refractive index difference between the light guide portion 1050 and the outside (the air). Accordingly, a reflection film or the like is not formed at the first surface 1056 and the second surface 1057.

The emission portion 1058 is configured as a part of the light guide portion 1050 on the second surface 1057 side in thickness direction of the light guide portion 1050. In the emission portion 1058, a plurality of partial reflection surfaces 1055 that are inclined obliquely with respect to a normal line with respect to the second surface 1057 are arranged in parallel to each other. The emission portion 1058 is a portion, which overlaps with the plurality of partial reflection surfaces 1055, of the second surface 1057, and is a region having a predetermined width in a direction in which the light guide portion 1050 extends. Each of the plurality of partial reflection surfaces 1055 is composed of a dielectric multilayer film. Further, at least one of the plurality of partial reflection surfaces 1055 may be a composite layer of a dielectric multilayer film and a reflective metal layer (a thin film) mainly formed of aluminum, silver, magnesium, chrome, or the like. When the partial reflection surface 1055 is configured to include a metal layer, an effect can be obtained to improve the reflectance of the partial reflection surface 1055, or an effect can be obtained that the incident angle dependence and the polarization dependence of the transmittance and the reflectance of the partial reflection surface 1055 are optimized. Note that the emission portion 1058 may be an aspect in which an optical element, such as a diffraction grating, a hologram, or the like is provided.

In the virtual image display apparatus 1000 thus configured, the synthesized light Lb composed of the parallel light incident from the incident portion 1040, is refracted by the incident surface 1041 to advance toward the reflection surface 1042. Next, the synthesized light Lb is reflected by the reflection surface 1042 to advance toward the incident surface 1041 again. The synthesized light Lb is then incident on the incident surface 1041 at the incident angle not less than the critical angle, and the synthesized light Lb is reflected by the incident surface 1041 toward the light guide portion 1050 to advance toward the light guide portion 1050. Note that the incident portion 1040 has a configuration in which the synthesized light Lb being parallel light is incident on the incident surface 1041, and a configuration may also be employed in which the incident surface 1041 and the reflection surface 1042 are formed of a free form curve or the like, and the synthesized light Lb being non-parallel light is incident on the incident surface 1041, then, the synthesized light Lb is converted into parallel light while being reflected between the reflection surface 1042 and the incident surface 1041.

In the light guide portion 1050, the synthesized light Lb is reflected between the first surface 1056 and the second surface 1057, and proceeds forward. Then, a part of the synthesized light Lb being incident on the partial reflection surface 1055 is reflected by the partial reflection surface 1055 to be emitted from the emission portion 1058 toward an eye E of the observer. Further, the rest of the synthesized light Lb incident on the partial reflection surface 1055 passes through the partial reflection surface 1055 to be incident on the next, adjacent, partial reflection surface 1055. This allows the synthesized light Lb being reflected by each of the plurality of partial reflection surfaces 1055 to be emitted from the emission portion 1058 toward the eye E of the observer. This makes the observer to recognize a virtual image. Then, the light from the outside, which entered the light guide portion 1050 from the outside, passes through the partial reflection surfaces 1055 to reach the eye E of the observer. This enables the observer to see a color image emitted from the image display device 1, as well as to see the scenery of the outside world or the like in a see-through manner.

Projector

Next, as an example of the virtual image display apparatus of the present disclosure, a projector including the image display device 1 will be described below.

Figure 14:
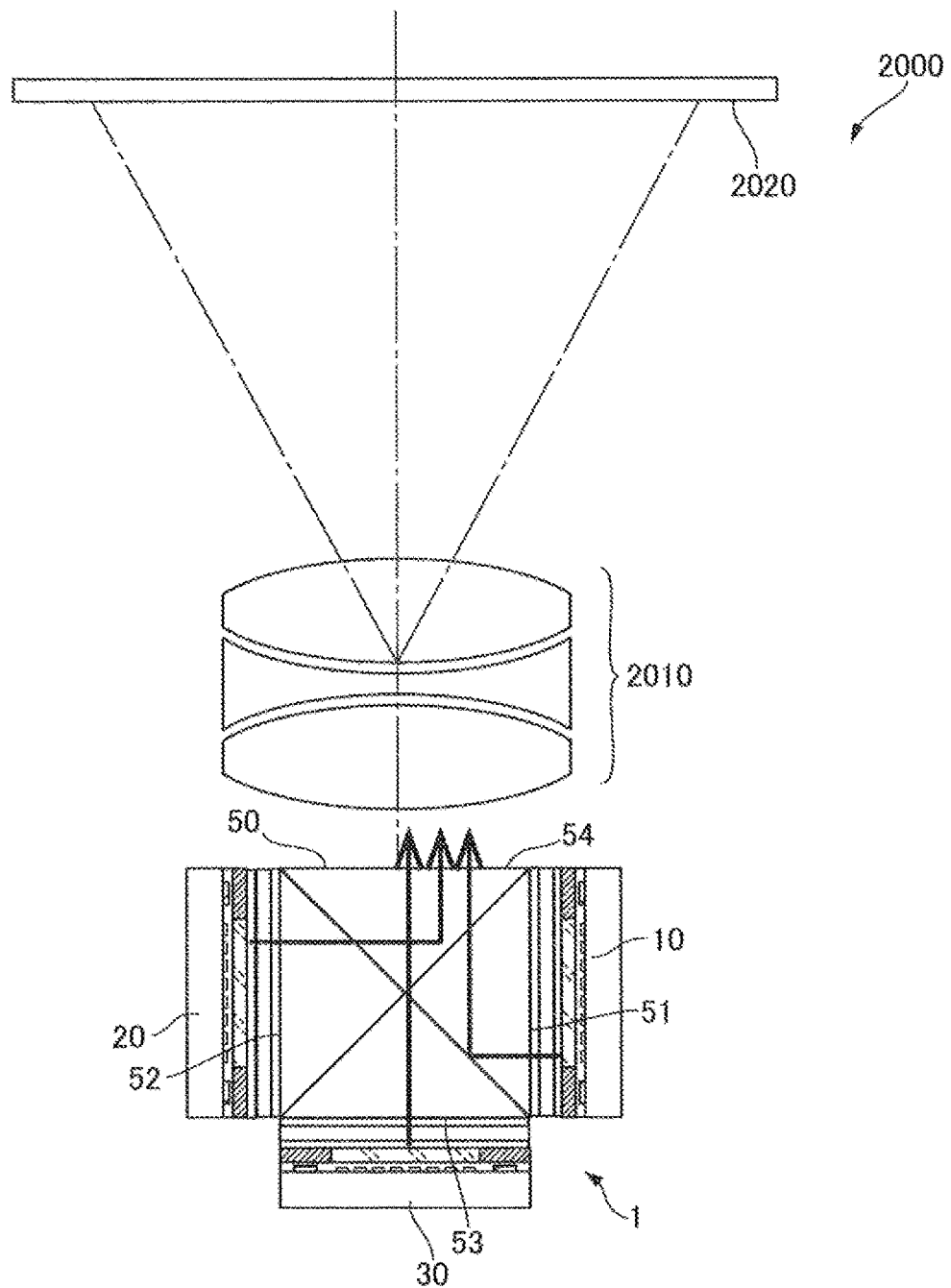
FIG. 14 is an explanatory view of a virtual image display apparatus of a projection type.

FIG. 14 is an explanatory view of a virtual image display apparatus of a projection type.

As illustrated in FIG. 14, a virtual image display apparatus 2000 is a projector including the image display device 1, and a projection optical system 2010 that enlarges and projects the synthesized light Lb emitted from the image display device 1 onto a projected member 2020 such as a screen, or the like.

According to the virtual image display apparatus 2000, an image formed in the image display device 1 is displayed as being magnified in the projected member 2020.

Note that the virtual image display apparatus of the present disclosure can also be applied to a head-up display (HUD) and the like, in addition to a head-mounted display (HMD) and a projector configured as described above.

The image display device 1 and the virtual image display apparatus of the present disclosure are described above based on the illustrated embodiments, however, the present disclosure is not limited to the embodiments.

For example, in the image display device 1 and the virtual image display apparatus of the present disclosure, the constitutional elements may be replaced with any element that can exhibit similar functionality, or an element having any configuration may be added.

Further, in the above-described embodiments, cases are described in which the image display device 1 includes an organic EL element as a self-luminous element, however, in the present disclosure, the self-luminous element may be constituted by, for example, a light-emitting diode (LED), a micro light-emitting diode (µLED), or the like, without being limited to an organic EL element.

In addition, in the above-described embodiments, cases are described in which the first light-emitting element 15 included in the image display device 1 emits the first image light LR of red color, the second light-emitting element 25 emits second image light LB of blue color, and the third light-emitting element 35 emits the third image light LG of green color, to thus cause the image display device 1 to emit image light of full color, the present disclosure is not limited to the cases, and the image light emitted from the first light-emitting element 15, the second light-emitting element 25, and the third light-emitting element 35 may be of a combination of various colors, depending on the colors of the image light emitted from the image display device 1.

Next, specific examples of the present disclosure will be described below.

1. Manufacture of Light-Emitting Element

Example 1

Manufacture of Red Light-Emitting Element

<1> First, a transparent glass substrate having the average thickness of 0.5 mm was prepared. Next, a first power supply conductor, that is, a reflective film composed of AlCu having the average thickness of 150 nm was formed on the substrate by a sputtering method.

<2> Next, an SiO₂ layer having the average thickness of 30 nm, an SiN layer having the average thickness of 30 nm, and an SiO₂ layer having the average thickness of 155 nm were formed sequentially on the reflective film by a sputtering method, to thus form an optical adjustment layer constituted by a layered body in which these layers are layered.

<3> Next, a first electrode, that is, a transparent electrode composed of ITO having the average thickness of 20 nm was formed on the optical adjustment layer by a sputtering method.

Then, the substrate constituted by these layers was immersed in acetone and 2-propanol in this order, and was treated with ultrasonic cleaning. Then, oxygen plasma treatment and argon plasma treatment were conducted on the resultant substrate. These plasma treatments were each performed at a plasma power of 100 W, a gas flow rate of 20 sccm, and a treatment time of 5 sec in a state where the substrate is heated at a temperature from not lower than 70° C. to not higher than 90° C.

<4> Next, on the transparent electrode, N4,N4'-(biphenyl-4,4'-diyl)bis(N4,N4',N4'-triphenylbiphenyl-4,4'-diamine) represented by Formula (1) below was deposited by a vacuum deposition method to form a hole transport layer having the average thickness of 30 nm.

[Formula 3]

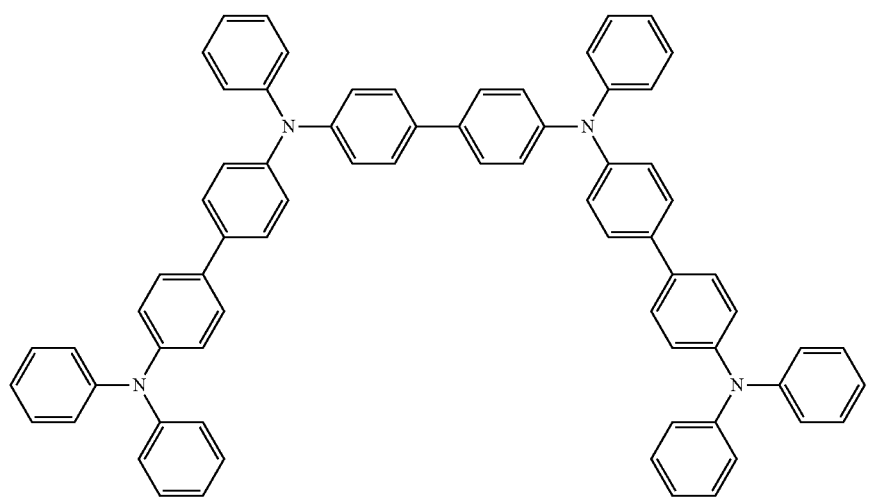

(1)

<5> Next, constituent materials of the light-emitting layer were deposited on the hole transport layer by a vacuum deposition method to form a light-emitting layer having the average thickness of 30 nm. As the constituent materials of the light-emitting layer, a tetraaryldiindenoperylene derivative such as that represented by Formula (2) below was used as a luminescent material (a guest material) and a tetracene derivative such as that represented by Formula (3) below was used as a host material. Further, the content (doping concentration) of the luminescent material (a dopant) in the light-emitting layer was designated as 1.0 wt %.

[Formula 4]

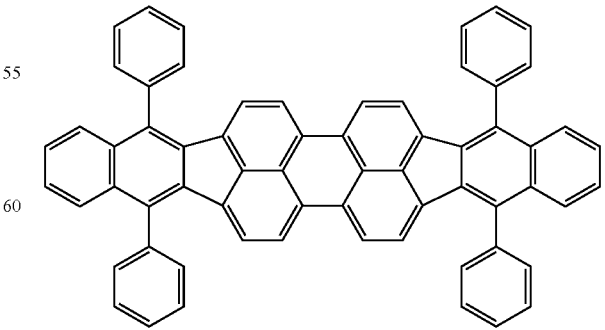

(2)

-continued

[Formula 5]

(3)

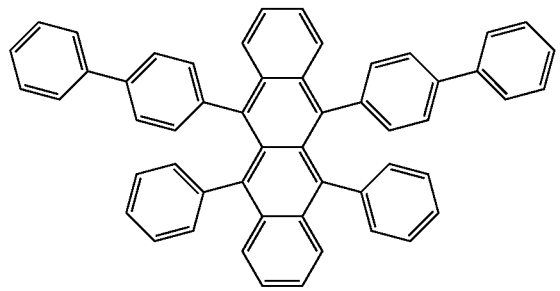

<6> Next, an azaindolizine derivative, 2,9-dimethyl-4,7-diphenyl-1,10-phenanthroline (BCP) such as that represented by Formula (4) below was deposited on the light-emitting layer by a vacuum deposition method to form an electron transport layer having the average thickness of 40 nm.

[Formula 6]

(4)

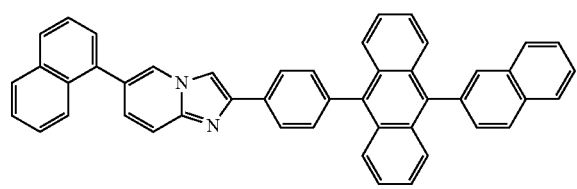

<7> Next, LiF was deposited on the electron transport layer by a vacuum deposition method to form an electron injection layer having the average thickness of 1 nm composed of LiF.

<8> Next, MgAg was deposited on the electron injection layer by a vacuum deposition method to form a second electrode, that is, a semireflective semitransmissive electrode having the average thickness of 20 nm composed of MgAg.

<9> Next, a glass protective cover (a sealing member) was placed to cover the formed layers, and was fixed and sealed with an epoxy resin.

The red light-emitting element was manufactured through the above-described steps.

Manufacture of Blue Light-Emitting Element

The blue light-emitting element was manufactured in the same manner as the red light-emitting element except that in the step <2>, in place of the SiO$_2$ layer having the average thickness of 155 nm, an SiO$_2$ layer having the average thickness of 30 nm was formed, and in the step <4>, a hole transport layer having the average thickness of 50 nm was formed, in the step <5>, a distyryldiamine compound represented by Formula (5) below was used as a luminescent material (a guest material) and an anthracene derivative such as that represented by Formula (6) below was used as a host material to form a light-emitting layer with the content (doping concentration) of the luminescent material (a dopant) being 6.0 wt %, and in the step <6>, an electron transport layer with the average thickness of 20 nm was formed.

[Formula 7]

(5)

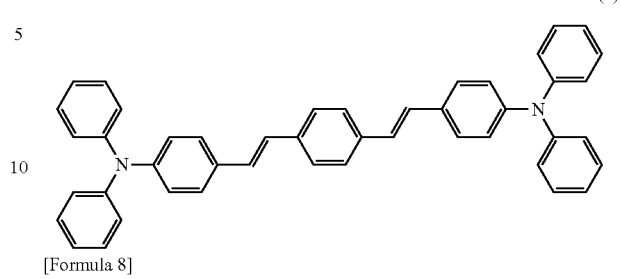

[Formula 8]

(6)

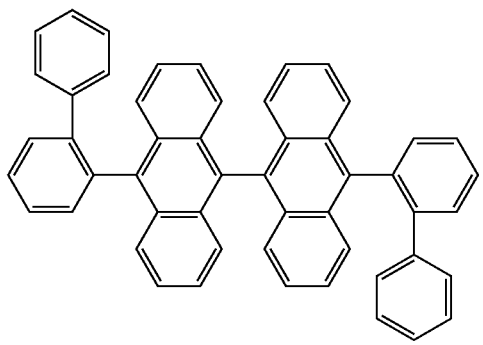

Manufacture of Green Light-Emitting Element

The green light-emitting element was manufactured in the same manner as the red light-emitting element except that in the step <2>, in place of the SiO$_2$ layer having the average thickness of 155 nm, an SiO$_2$ layer having the average thickness of 75 nm is formed, in the step <4>, a hole transport layer having the average thickness of 40 nm is formed, in the step <5>, a quinacridone derivative represented by Formula (7) below was used as a luminescent material (a guest material) and an anthracene derivative such as that represented by Formula (6) above was used as a host material to form a light-emitting layer, and in the step <6>, an electron transport layer having the average thickness of 30 nm was formed.

[Formula 9]

(7)

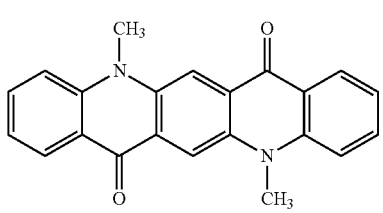

Examples 2 to 4, and Comparative Example

As listed in Table 1, the red light-emitting element, the blue light-emitting element, and the green light-emitting element of Examples 2 to 4 and Comparative Example were manufactured in the same manner as in the above-described Example 1 except that the thicknesses of red light-emitting element, the blue light-emitting element, and the green light-emitting element were altered as listed in Table 1 and Table 2.

2. Evaluation

As for the red light-emitting element, the blue light-emitting element, and the green light-emitting element of the examples and comparative example, a constant current power source (Keithley2400 available from Keithley Instruments, Inc.) was used to cause a constant current of 100 mA/cm² to flow through the light-emitting elements. Then, the luminescence intensity at the peak emission wavelength at this time was measured using a high-speed spectroradiometer (CS-2000 available from Konica Minolta, Inc.). Further, the luminescence intensity measured at each of the light-emitting element of Example 1 was set to be 1, and the luminescence intensity measured at the light-emitting elements of the other examples and the comparative examples was normalized. In addition, a constant current of 100 mA/cm² was caused to pass through each of the light-emitting elements, and the driving voltage at that time was measured using a digital multi-meter (Keithley2400 available from Keithley Instruments, Inc.).

These measurement results are listed in Table 1 and Table 2.

TABLE 1

| | | | Example 1 | | | Example 2 | | | Example 3 | | |
|---|---|---|---|---|---|---|---|---|---|---|---|
| | | | Red light-emitting element | Blue light-emitting element | Green light-emitting element | Red light-emitting element | Blue light-emitting element | Green light-emitting element | Red light-emitting element | Blue light-emitting element | Green light-emitting element |
| Organic EL element | Semireflective Semitransmissive Electrode (Cathode) | MgAg (nm) | | 20 | | | 20 | | | 20 | |
| | Light-emitting functional layer | Electron injection layer (nm) | | 1 | | | 1 | | | 1 | |
| | | Electron transport layer (nm) | 40 | 20 | 30 | 40 | 20 | 30 | 40 | 20 | 30 |
| | | Light-emitting layer (nm) | 30 | 30 | 30 | 30 | 30 | 30 | 30 | 30 | 30 |
| | | Hole transport layer (nm) | 30 | 50 | 40 | 40 | 50 | 40 | 30 | 50 | 85 |
| Substrate | Transparent electrode (Anode) | ITO (nm) | | 20 | | | 20 | | | 20 | |
| | Optical adjustment layer | $SiO_2$ (nm) | 155 | 30 | 75 | 145 | 30 | 75 | 155 | 30 | 30 |
| | | SiN (nm) | 30 | 30 | 30 | 30 | 30 | 30 | 30 | 30 | 30 |
| | | $SiO_2$ (nm) | 30 | 30 | 30 | 30 | 30 | 30 | 30 | 30 | 30 |
| | Reflective film | AlCu (nm) | | 150 | | | 150 | | | 150 | |
| Evaluation | Driving Voltage (@100 mA/cm²) | (mV) | 5.2 | 5.5 | 5.4 | 5.3 | 5.5 | 5.4 | 5.2 | 5.5 | 5.8 |
| | Luminescence intensity (@100 mA/cm²) | (Normalized with the intensity of Example 1-1) | 1 | 1 | 1 | 0.99 | 1 | 1 | 1 | 1 | 0.97 |

TABLE 2

| | | | Example 4 | | | Comparative Example | | |
|---|---|---|---|---|---|---|---|---|
| | | | Red light-emitting element | Blue light-emitting element | Green light-emitting element | Red light-emitting element | Blue light-emitting element | Green light-emitting element |
| Organic EL element | Semireflective Semitransmissive Electrode (Cathode) | MgAg (nm) | | 20 | | | 20 | |
| | Light-emitting functional layer | Electron injection layer (nm) | | 1 | | | 1 | |
| | | Electron transport layer (nm) | 40 | 20 | 30 | 40 | 20 | 30 |
| | | Light-emitting layer (nm) | 30 | 30 | 30 | 30 | 30 | 30 |
| | | Hole transport layer (nm) | 30 | 50 | 40 | 135 | 50 | 80 |
| Substrate | Transparent electrode (Anode) | ITO (nm) | 120 | 20 | 55 | | 20 | |
| | Optical adjustment layer | $SiO_2$ (nm) | 30 | 30 | 30 | | 30 | |
| | | SiN (nm) | 30 | 30 | 30 | | 30 | |
| | | $SiO_2$ (nm) | 30 | 30 | 30 | | 30 | |
| | Reflective film | AlCu (nm) | | 150 | | | 150 | |
| Evaluation | Driving Voltage (@100 mA/cm²) | (mV) | 5.2 | 5.5 | 5.4 | 6.8 | 5.5 | 5.8 |
| | Luminescence intensity (@100 mA/cm²) | (Normalized with the intensity of Example 1-1) | 0.82 | 1 | 0.85 | 0.98 | 1 | 0.97 |

As is apparent from Table 1 and Table 2, in the red light-emitting element, the blue light-emitting element, and the green light-emitting element of the examples, the optimization of the optical path length between the first power supply conductor being a transparent electrode and the second electrode being a semireflective semitransmissive electrode was performed by altering the sum of the thickness of transparent electrode and the thickness of the optical adjustment layer. Accordingly, the thickness of the organic layer including a light-emitting layer can be set in view of its light-emitting characteristics, and thus, the driving voltages of the red light-emitting element, the blue light-emitting element, and the green light-emitting element could be set to be approximately identical among the light-emitting elements when an approximately identical luminescence intensity is obtained in the red light-emitting element, the blue light-emitting element, and the green light-emitting element.

In contrast, in the red light-emitting element, the blue light-emitting element, and the green light-emitting element of the comparative example, the optimization of the optical path length between the first power supply conductor being a reflective film and the second electrode being a semireflective semitransmissive electrode was performed by altering the thickness of the organic layer including a light-emitting layer. Due to the above, the thickness of the organic layer cannot be set in view of its light-emitting characteristics, and as a result, the driving voltages of the red light-emitting element, the blue light-emitting element, and the green light-emitting element could not set to be identical among the light-emitting elements for obtaining an approximately identical luminescence intensity in the red light-emitting element, the blue light-emitting element, and the green light-emitting element. More specifically, in the red light-emitting element having a longer optical path length, a result was obtained in which the driving voltage became higher.

What is claimed is:

1. An image display device comprising:
a first self-luminous display element that emits an image of first color light having a peak in a first color region;
a second self-luminous display element that emits an image of second color light having a peak in a second color region;
a third self-luminous display element that emits an image of third color light having a peak in a third color region; and
a prism including a dichroic mirror that synthesizes the first color light, the second color light, and the third color light, wherein
the first self-luminous display element includes a first support substrate, and a first reflective film, a first optical adjustment layer, a first transparent electrode, a first light-emitting layer, and a first semireflective semitransmissive electrode that are laminated in order from the first support substrate side,
the second self-luminous display element includes a second support substrate, and a second reflective film, a second optical adjustment layer, a second transparent electrode, a second light-emitting layer, and a second semireflective semitransmissive electrode that are laminated in order from the second support substrate side, and
the third self-luminous display element includes a third support substrate, and a third reflective film, a third optical adjustment layer, a third transparent electrode, a third light-emitting layer, and a third semireflective semitransmissive that are laminated in order from the third support substrate side, wherein
the first color light is extracted from the first semireflective semitransmissive electrode of the first self-luminous display element, the second color light is extracted from the second semireflective semitransmissive electrode of the second self-luminous display element, and the third color light is extracted from the third semireflective semitransmissive electrode of the third self-luminous display element, wherein
when a sum of a thickness of the first transparent electrode and a thickness of the first optical adjustment layer is a first lamination thickness, a sum of a thickness of the second transparent electrode and a thickness of the second optical adjustment layer is a second lamination thickness, and a sum of a thickness of the third transparent electrode and a thickness of the third optical adjustment layer is a third lamination thickness,
the first lamination thickness differs from at least one of the second lamination thickness and the third lamination thickness.

2. The image display device according to claim 1, wherein each of the optical adjustment layers in the first self-luminous display element, the second self-luminous display element, and the third self-luminous display element is constituted of a laminated body of two or more layers.

3. The image display device according to claim 1, wherein the first self-luminous display element, the second self-luminous display element, and the third self-luminous display element are each an organic electroluminescent element.

4. The image display device according to claim 3, wherein
the first self-luminous display element includes a first organic layer including the first light-emitting layer,
the second self-luminous display element includes a second organic layer including the second light-emitting layer, and
the third self-luminous display element includes a third organic layer including the third light-emitting layer, wherein
an error in thicknesses between the first organic layer, the second organic layer, and the third organic layer is ±20% or less.

5. The image display device according to claim 4, wherein the first lamination thickness is greater than the first organic layer, the second lamination thickness is greater than the second organic layer, and the third lamination thickness is greater than the third organic layer.

6. The image display device according to claim 1, wherein the thicknesses of the first transparent electrode, the second transparent electrode, and the third transparent electrode are identical to one another.

7. The image display device according to claim 1, wherein
the thickness of the first optical adjustment layer is greater than the thickness of the first transparent electrode,
the thickness of the second optical adjustment layer is greater than the thickness of the second transparent electrode, and
the thickness of the third optical adjustment layer is greater than the thickness of the third transparent electrode.

8. A virtual image display apparatus, comprising the image display device according to claim 1.

* * * * *